(12) United States Patent
Poonawala et al.

(10) Patent No.: US 12,265,325 B2
(45) Date of Patent: Apr. 1, 2025

(54) INVERSE LITHOGRAPHY AND MACHINE LEARNING FOR MASK SYNTHESIS

(71) Applicant: Synopsys, Inc., Sunnyvale, CA (US)

(72) Inventors: Amyn A. Poonawala, Santa Clara, CA (US); Jason Jiale Shu, San Jose, CA (US); Thomas Chrisptopher Cecil, Menlo Park, CA (US)

(73) Assignee: Synopsys, Inc., Sunnyvale, CA (US)

( * ) Notice: Subject to any disclaimer, the term of this patent is extended or adjusted under 35 U.S.C. 154(b) by 39 days.

(21) Appl. No.: 18/228,509

(22) Filed: Jul. 31, 2023

(65) Prior Publication Data
US 2023/0375916 A1   Nov. 23, 2023

Related U.S. Application Data

(62) Division of application No. 17/102,180, filed on Nov. 23, 2020, now Pat. No. 11,762,283.
(Continued)

(51) Int. Cl.
| | | |
|---|---|---|
| *G06N 20/10* | (2019.01) | |
| *G03F 1/36* | (2012.01) | |
| *G03F 1/70* | (2012.01) | |
| *G03F 1/76* | (2012.01) | |
| *G06F 30/33* | (2020.01) | |

(Continued)

(52) U.S. Cl.
CPC ............ *G03F 1/70* (2013.01); *G03F 1/36* (2013.01); *G03F 1/76* (2013.01); *G06F 30/33* (2020.01); *G06F 30/39* (2020.01); *G06N 3/08* (2013.01)

(58) Field of Classification Search
CPC ...... G03F 1/70; G03F 1/36; G03F 1/76; G03F 7/70441; G03F 7/705; G06F 30/33; G06F 30/39; G06F 30/398; G06N 3/08; G06N 5/01; G06N 3/045; G06N 20/10
See application file for complete search history.

(56) References Cited

U.S. PATENT DOCUMENTS

| | | |
|---|---|---|
| 7,178,127 B2 | 2/2007 | Abrams et al. |
| 7,617,478 B2 | 11/2009 | Rieger et al. |

(Continued)

FOREIGN PATENT DOCUMENTS

| | | |
|---|---|---|
| TW | I600962 B | 10/2017 |
| WO | 2018215188 A1 | 11/2018 |

(Continued)

OTHER PUBLICATIONS

Wang Shibing et al: "Machine learning assisted SRAF placement for full chip", Proceedings of SPIE, vol. 10451, Oct. 16, 2017 (Oct. 16, 2017), pp. 104510D-104510D, XP060095869.

(Continued)

*Primary Examiner* — Nghia M Doan
(74) *Attorney, Agent, or Firm* — Patterson + Sheridan, LLP

(57) ABSTRACT

Techniques relating to synthesizing masks for use in manufacturing a semiconductor device are disclosed. These techniques include providing, by a processor, a design pattern for a semiconductor device as input to a trained machine learning (ML) model. The techniques further include performing, using the ML Model, a plurality of dilated convolutions relating to the design pattern, and inferring, using the ML model, one or more masks for use in manufacturing the semiconductor device, based on the plurality of dilated convolutions.

20 Claims, 16 Drawing Sheets

Related U.S. Application Data

(60) Provisional application No. 62/948,158, filed on Dec. 13, 2019.

(51) Int. Cl.
*G06F 30/39* (2020.01)
*G06N 3/08* (2023.01)

(56) References Cited

U.S. PATENT DOCUMENTS

| | | | |
|---|---|---|---|
| 10,310,372 | B1 | 6/2019 | Yenikaya |
| 11,379,970 | B2 * | 7/2022 | Koopman ................ G06T 7/11 |
| 2018/0095359 | A1 * | 4/2018 | Jeong ..................... G06F 17/14 |
| 2019/0146455 | A1 | 5/2019 | Beylkin et al. |
| 2019/0206041 | A1 | 7/2019 | Fang et al. |
| 2020/0089998 | A1 | 3/2020 | Zagaynov et al. |
| 2020/0278604 | A1 | 9/2020 | Lo et al. |
| 2023/0341315 | A1 * | 10/2023 | Chou .................. G01N 21/658 |

FOREIGN PATENT DOCUMENTS

| | | |
|---|---|---|
| WO | 2019048506 A1 | 3/2019 |
| WO | 2019158682 A1 | 8/2019 |
| WO | 2019162204 A1 | 8/2019 |
| WO | 2019162346 A1 | 8/2019 |

OTHER PUBLICATIONS

Ningning Jia et al: "Machine learning for inverse lithography: using stochastic gradient descent or robust photomask synthesis", Journal of Optics, vol. 12, No. 4, Apr. 1, 2010 (Apr. 1, 2010 ), p. 45601, XP020178803.

International Search Report and Written Opinion Application No. PCT/US2020/062070 Dated Mar. 15, 2021 Consists of 19 pages.

International Preliminary Report on Patentability Application No. PCT/US2020/062070 Dated Jun. 23, 2022 Consists of 12 pages.

Taiwan Patent Application No. 109141509, Office Action and Search Report dated Sep. 26, 2024.

* cited by examiner

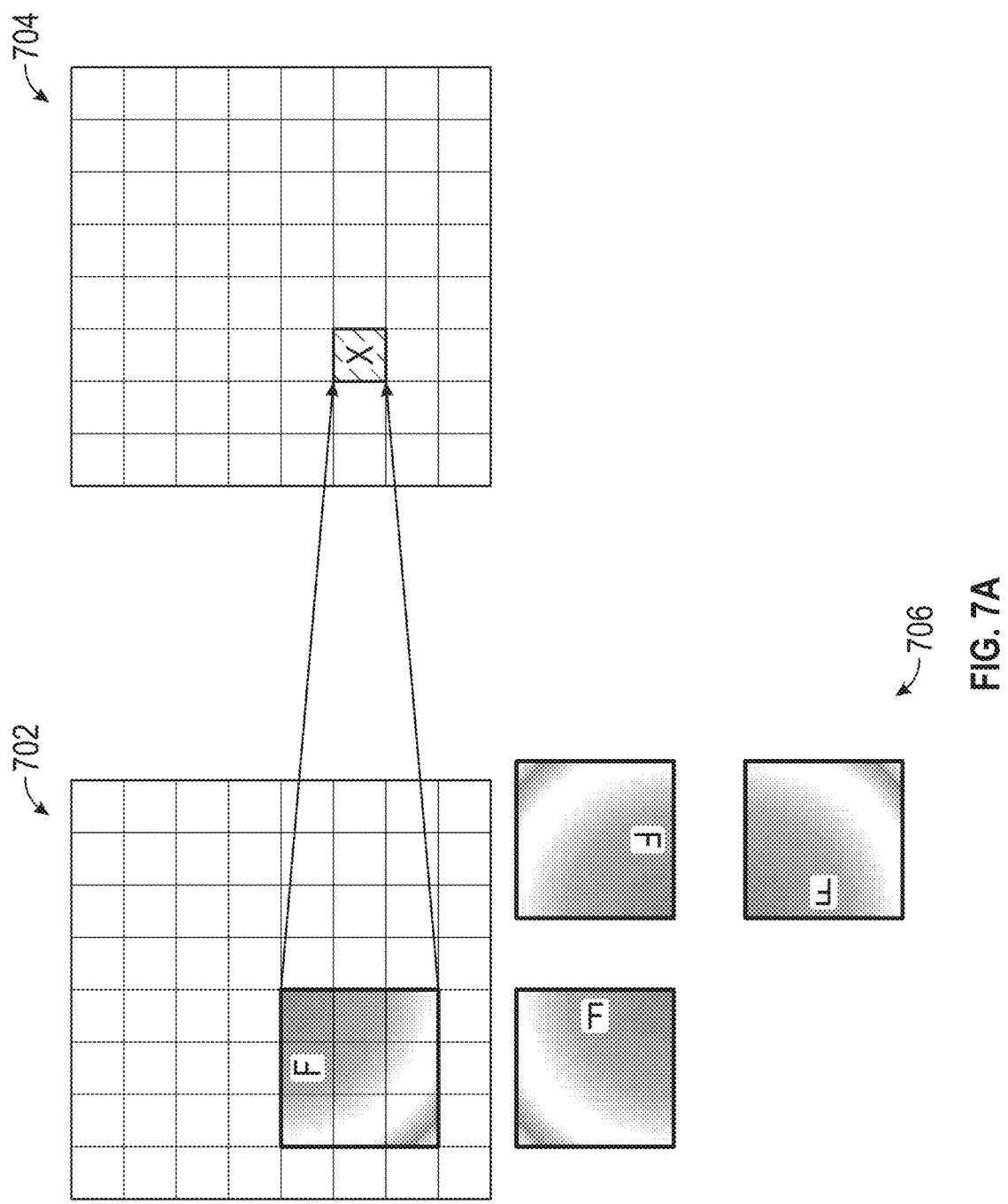

INVERSE LITHOGRAPHY AND MACHINE LEARNING FOR MASK SYNTHESIS

CROSS-REFERENCE TO RELATED APPLICATION

The present disclosure is a divisional application of U.S. Non-Provisional patent application Ser. No. 17/102,180 filed on Nov. 23, 2020, which claims priority to and the benefit of U.S. Provisional Patent Application No. 62/948,158, filed Dec. 13, 2019, which is incorporated by reference in its entirety.

TECHNICAL FIELD

Embodiments presented in this disclosure generally relate to semiconductor manufacturing and machine learning. More specifically, one or more embodiments disclosed herein relate to use of Inverse Lithography Technology to generate training data and train machine learning models for mask synthesis.

BACKGROUND

Lithography processing represents an important technology for manufacturing Integrated Circuits (ICs) and Micro Electro-Mechanical Systems (MEMS). Lithographic techniques are used to define patterns, geometries, features, shapes, et al ("patterns") onto an integrated circuit die or semiconductor wafer or chips, where the patterns can be defined by a set of contours, lines, boundaries, edges, curves, et al, which surround, enclose, or define the boundary of the various regions which constitute a pattern.

Demand for increased density of features on dies and wafers has resulted in the design of circuits with decreasing minimum dimensions. However, due to the wave nature of light, as dimensions approach sizes comparable to the wavelength of the light used in the photolithography process, the resulting wafer patterns deviate from the corresponding mask (e.g., photomask) patterns and are accompanied by unwanted distortions and artifacts. Inverse Lithography Technology (ILT) can be highly effective for addressing these issues and synthesizing high quality masks for manufacturing advanced silicon-based compute nodes. However, the increased quality typically comes with significant computational burden and long tool runtimes. This can discourage use of ILT for mask synthesis.

Machine learning (ML) techniques can be used to accelerate mask synthesis. Supervised ML models, however, require appropriate training data to successfully solve a given problem. Generating this training data, and designing an appropriate ML model structure to assist in mask synthesis, is a challenging problem.

SUMMARY

Embodiments further include another method. The method includes providing, by a processor, a design pattern for a semiconductor device as input to a trained ML model. The method further includes performing, using the ML Model, a plurality of dilated convolutions relating to the design pattern. The method further includes inferring, using the ML model, one or more masks for use in manufacturing the semiconductor device, based on the plurality of dilated convolutions.

Embodiments further include a system, including a processor, and a memory storing instructions which when executed by the processor, cause the processor to perform operations. The operations include providing a design pattern for a semiconductor device as input to a trained ML model. The operations further include performing, using the ML Model, a plurality of dilated convolutions relating to the design pattern. The operations further include inferring, using the ML model, one or more masks for use in manufacturing the semiconductor device, based on the plurality of dilated convolutions.

Embodiments further include a non-transitory computer program product, including a non-transitory computer-readable storage medium having computer-readable program code embodied therewith, the computer-readable program code executable by one or more computer processors to perform operations. The operations include providing a design pattern for a semiconductor device as input to a trained ML model. The operations further include performing, using the ML Model, a plurality of dilated convolutions relating to the design pattern. The operations further include inferring, using the ML model, one or more masks for use in manufacturing the semiconductor device, based on the plurality of dilated convolutions.

BRIEF DESCRIPTION OF THE DRAWINGS

The disclosure will be understood more fully from the detailed description given below and from the accompanying figures of examples described herein. The figures are used to provide knowledge and understanding of examples described herein and do not limit the scope of the disclosure to these specific examples. Furthermore, the figures are not necessarily drawn to scale.

FIG. 7A illustrates symmetry in an ML model for mask synthesis, according to one embodiment.

To facilitate understanding, identical reference numerals have been used, where possible, to designate identical elements that are common to the figures. It is contemplated that elements disclosed in one embodiment may be beneficially used in other embodiments without specific recitation.

DETAILED DESCRIPTION

ILT can be used to improve training of ML models for mask synthesis. For example, ILT can be used to generate synthesized masks to use as training data to train a supervised ML model. The trained ML model can then be used to infer a synthesized mask, using a design pattern. This can greatly improve the accuracy of the ML model by facilitating creation of a large and accurate sample of training data to use in training the ML model.

Further, an ML model structure can be designed to compensate for potential issues in using a design pattern to infer a synthesized mask. For example, the ML model can be designed for translational invariance, model grid shift invariance, and symmetry. This is discussed further below. The ML model can then be used to generate a synthesized mask. In an embodiment, the ML model outputs the synthesized mask in a format that is not suitable for native use by lithography tools (e.g., a rasterized or level-set representation). A variety of post-processing techniques can be used to convert the mask output by the ML model to a polygon representation, or another representation suitable for native use by lithography tools.

Figure 1A:
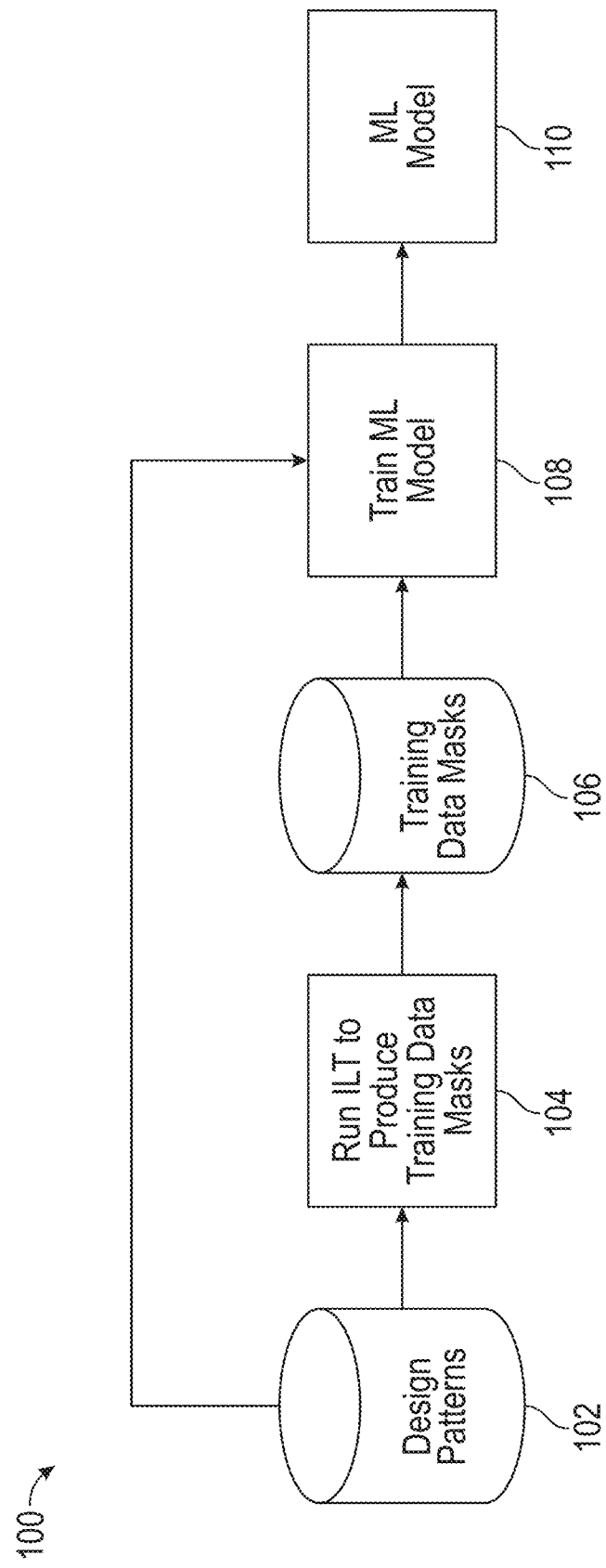
FIG. 1A is a flowchart for using ILT to train an ML model for mask synthesis, according to an embodiment.

FIG. 1A is a flowchart 100 for using ILT to train an ML model for mask synthesis, according to an embodiment. In an embodiment, a trained ML model 110 synthesizes masks (e.g., photomasks for use in lithography for manufacturing silicon ICs) using design patterns 102. For example, design patterns 102 can be generated by a designer of an IC (e.g., a chip designer, a semiconductor fabricator, etc.). The design patterns 102 can relate to any suitable IC, MEMS, etc. In an embodiment, the design patterns 102 can relate to a design for a particular device, representative portions of multiple devices, a design kit for multiple devices, etc. In an embodiment, the design patterns 102 are stored in a training database.

Figure 1B:
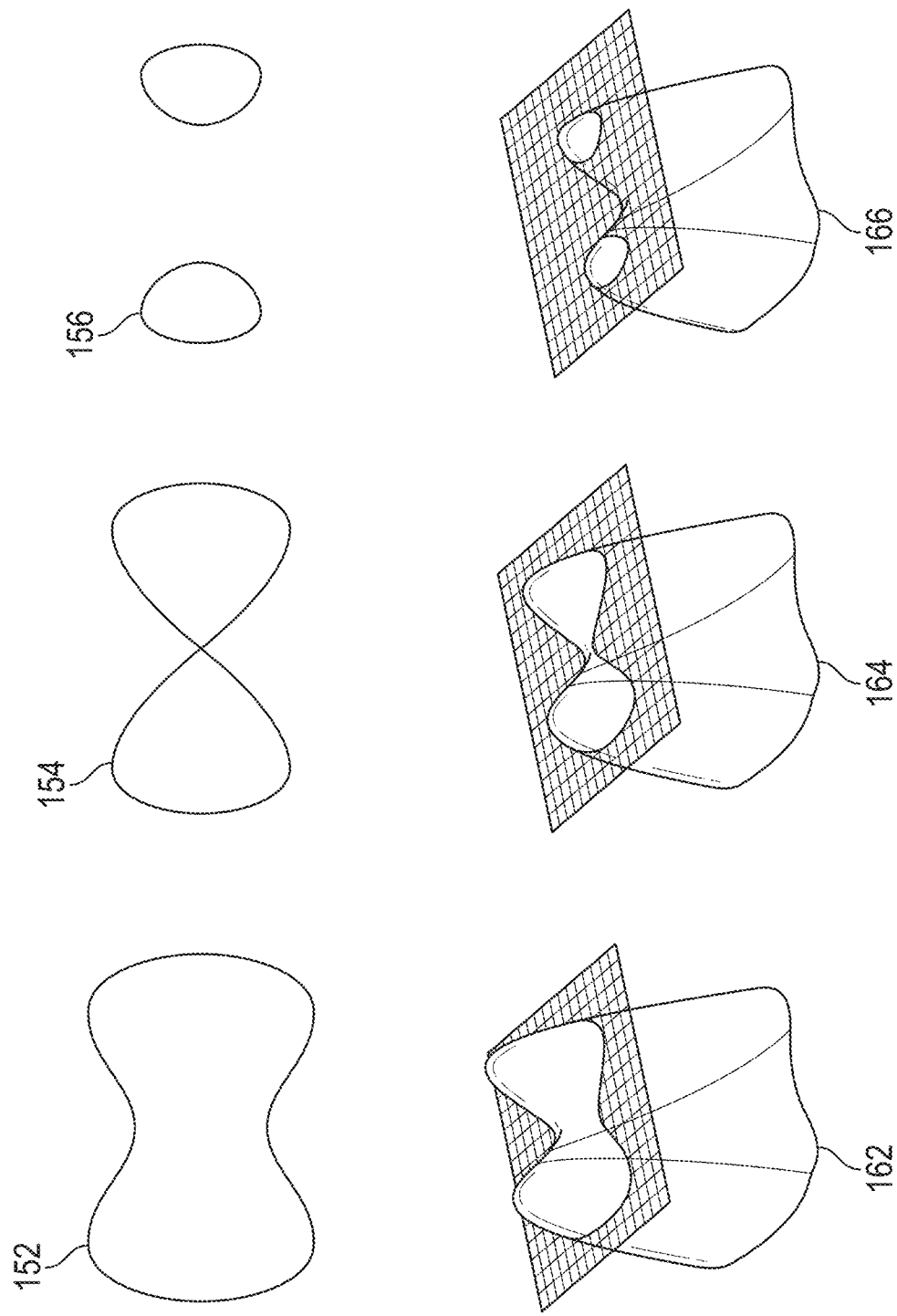
FIG. 1B illustrates level-set representations of mask polygons, according to an embodiment.

At block 104, ILT is used to produce training data masks from the design patterns 102. In an embodiment, standard ILT techniques can be used (e.g., without use of the ML model 110). As one example, level-sets can be used to represent the mask. For example, a level-set function $\psi(x, y)$ can be used to represent an example photomask pattern by defining contours which enclose the regions in a photomask pattern. In this example, $\psi(x, y)$ is a function with the following properties. First, $\psi(x, y)=0$ everywhere along the boundary of a region in the photomask pattern. Second, $\psi(x, y)>0$ "inside" a region in the photomask pattern (e.g., in regions corresponding to chrome portions of a mask). Third, $\psi(x, y)<0$, or is negative, "outside" a region in the photomask pattern (e.g., regions corresponding to clear quartz portions of a mask). Contours are defined by the "level-set", i.e. those values in the (x,y) plane such that $\psi(x, y)=0$. FIG. 1B, below, illustrates intersection of level-set functions with a planes parallel to the (x,y) plane. In embodiment, cost functions and cost function gradients can be used to drive mask optimization in level-set representation. Alternatively, or in addition to use of ILT to produce training data masks, an ML model could be used (e.g., a previously trained ML model).

FIG. 1B illustrates level-set representations of mask polygons, according to an embodiment. Level-set representation is discussed above. A mask polygon 152 can be represented as a level-set representation 162. A mask polygon 154 can be represented as a level-set representation 164. A mask polygon 156 can be represented as a level-set representation 166. In an embodiment, the mask polygons 152, 154, and 156 represent a mask polygon changing shape from a starting shape (e.g., the mask polygon 152) to a concluding shape (e.g., the mask polygon 156). The level-set representations 162, 164, and 166 are level-set representations of the corresponding mask polygons.

Returning to FIG. 1A, in an embodiment, ILT is used on a portion of the design patterns 102. For example, ILT can be used to generate training data masks for a subset of a particular IC (e.g., a portion of the IC). These training data masks can be used to train an ML model 110, which can then be used to generate a mask for the complete IC. Because, as discussed above, ILT is often very computationally intensive, this allows ILT to be used on a smaller portion of the IC (e.g., design patterns 102 representing a subset of the IC rather than the complete IC), saving compute time and resources. The ML model 110 can then generate masks for the complete IC. Alternatively, or in addition, at block 104 standard ILT generates masks for the complete IC, and the ML model 110 can also be used to generate masks for the complete IC. This can be advantageous because the ML model may be more accurate than standard ILT.

In an embodiment, selection of the design patterns 102 to use for ILT at block 104 can affect the effectiveness of the ILT techniques and the accuracy of the final ML model 110. For example, a set, P, of potential design patterns for mask synthesis can include billions of unique patterns. To select patterns for use in ILT, the set P can be grouped into subgroups, or clusters, which contain items similar enough to each other that one representative from each cluster can be used to represent the cluster. This grouping, or clustering, can be done in numerous ways.

In one example, a parallelized system can perform fuzzy pattern grouping and cluster the patterns using parallelization across multiple CPU nodes. This can be done using the following technique. First, take in a design layout(s) and uses distributed processing to find unique patterns (e.g., within a user specified window size at user specified window centers). A distributed system can partition the design into "templates," each of which will then be processed in parallel to find the unique windows. For each template one chooses a set of search windows, W, and clips the layout geometry to the window and obtains its hashkey (e.g., using existing techniques for computing an integer hashkey from a geometry layout clip). The hashkey can be used to build a global database of patterns. The geometry clip can be stored to a global database, D, of the form: D[hashkey]= geometry_polygons.

Second, train a machine learning auto-encoder model using distributed training. In an embodiment, this model can compress the data to a smaller size by storing the intermediate encoded portion of the model evaluation. A distributed ML training methodology can be used to train an autoencoder model, which has a smaller data size at its midpoint which represents the encoded data. The polygon data is first converted to a rasterized pixel grid so that convolutional neural networks can be used in subsequent steps. An auto-encode model can be used to fit the data to itself, with a low dimensional encoded representation at the midpoint of the model. This can be done using a training method akin to Stochastic Weight Averaging, which: 1. splits the data into chunks, 2. fits the model partially in parallel on each chunk, 3. averages the weights that came from each partial fitting to create a combined model, and 4. Returns to step 2 and continue training the model from its latest weight values found in step 3. In an embodiment, this allows the model to fit on a larger data set than would be able to be contained in memory on a single machine. Once the autoencoder is trained, the encoded version of each data point which can result in an image of a specified size (e.g., 1024×1024) being reduced to a smaller (e.g., 8×8) encoded representation is stored. This is done with distributed ML model inferencing. This is merely an example, and methods for creating an encoded data set can be used, for example taking a lithographic simulation of the polygons and extracting geometric/pixel information from that.

Third, cluster the compressed data patterns into clusters using a distributed hierarchical clustering methodology. For example, distributed hierarchical clustering can be used because typical clustering algorithms have computational complexity of O(kNd), where k is the number of clusters, N is the number of patterns to be clustered, and d is the dimension of the patterns. Hierarchical clustering reduces k and N (and thus turn-around-time per level) by successively splitting the data into sub-clusters, which can be subdivided in parallel. By distributing the work among two sub-clusters for branch of the tree, complexity is reduced to O(Ndlogk), which is a significant saving when k is large. This can also reduce memory used. This is merely an example, however, and other clustering techniques (e.g., which either run on a single machine or distributed machines) could also be used (e.g., k-means, spectral, agglomerative). The chosen clustering technique can depend on the data volume and other data characteristics as to which clustering method is best suited for the problem at hand. In an embodiment, k-means clustering can be used at each hierarchy branch of the clustering tree. This is merely an example, and other clustering techniques could be used. In an embodiment, once the clustering tree is completed the leaves of the tree are used as the final clusters.

Block 104 generates training data masks 106. In an embodiment, these training data masks 106 are provided, along with the design patterns 102, as inputs to block 108 and used to train the ML model 110. In an embodiment, the training data masks 106 are stored with the design patterns 102 in a training database and are provided together to train the ML model at block 108. Alternatively, the design patterns 102 and training data masks 106 are provided via separate data paths to train the ML model at block 108. As another alternative, only the training data masks 106 are used in training the ML model 110 (e.g., the design patterns 102 are not used in training the ML model 110).

The ILT mask data (e.g., the training data masks 106) can be represented in many different ways, as will be discussed further below. For example, the mask data can be rasterized and represented as a series of pixels in an image. Alternatively, or in addition, the mask data can be encoded as a set of offsets from the design edge (e.g., the patterns could be represented as offsets from the design edge). These are merely examples, and other representations could be used, including a level-set representation on a grid, a skeletonization of the mask polygons, potentially followed by a rasterization of the mask polygons, or other transformations.

Figure 2:
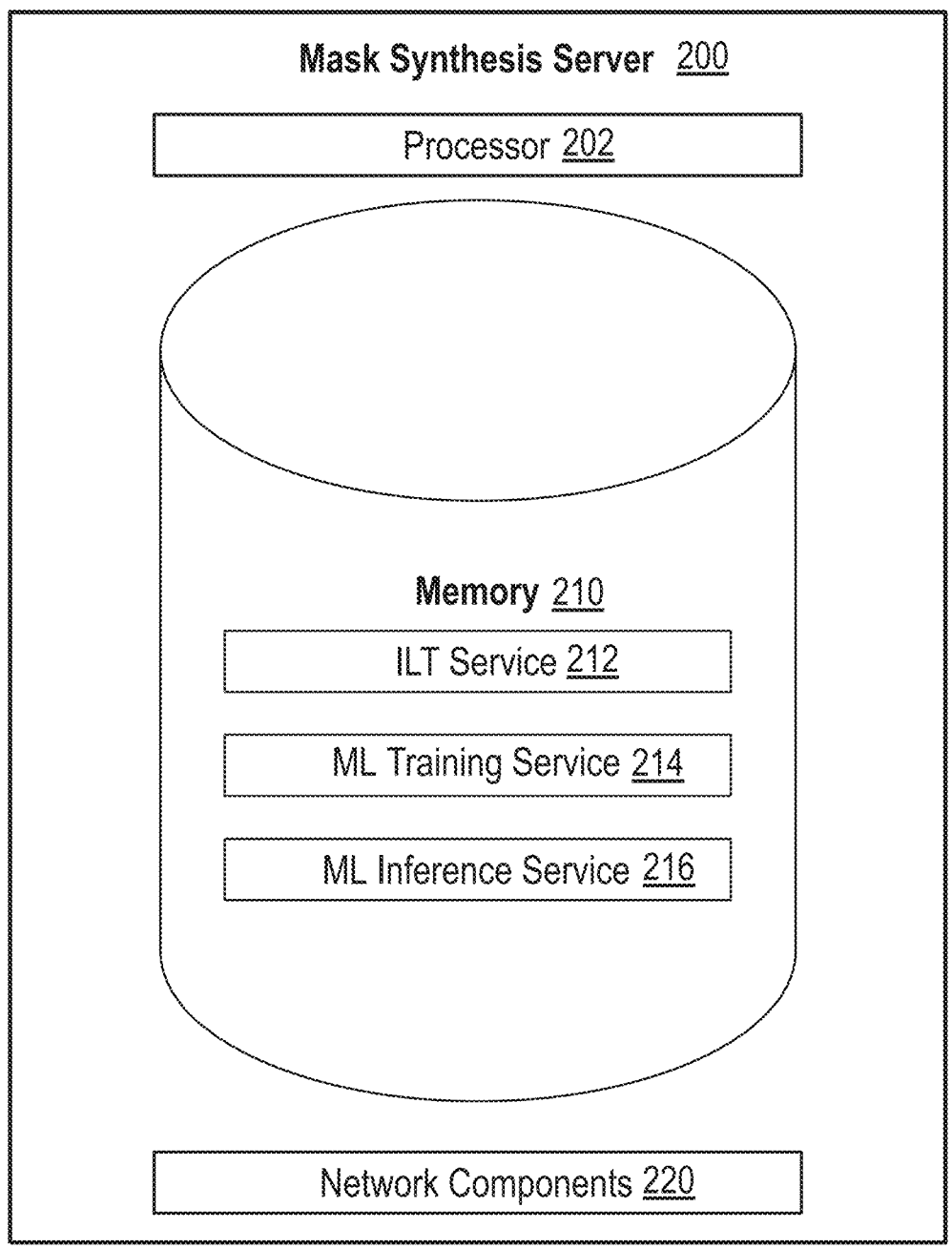
FIG. 2 is a block diagram illustrating a mask synthesis server for using an ML model for mask synthesis, according to an embodiment.

FIG. 2 is a block diagram illustrating a mask synthesis server 200 for using an ML model for mask synthesis, according to an embodiment. The mask synthesis server 200 includes a processor 202, a memory 210, and network components 220. The processor 202 generally retrieves and executes programming instructions stored in the memory 210. The processor 202 is included to be representative of a single central processing unit (CPU), multiple CPUs, a single CPU having multiple processing cores, graphics processing units (GPUs) having multiple execution paths, and the like.

The network components 220 include the components necessary for the mask synthesis server 200 to interface with components over a network. For example, the mask synthesis server 200 can interface with remote storage and compute nodes using the network components. The mask synthesis server 200 can interface with these elements over a local area network (LAN), for example an enterprise network, a wide area network (WAN), the Internet, or any other suitable network. The network components 220 can include wired, WiFi or cellular network interface components and associated software to facilitate communication between the mask synthesis server 200 and a communication network.

Although the memory 210 is shown as a single entity, the memory 210 may include one or more memory devices having blocks of memory associated with physical addresses, such as random access memory (RAM), read only memory (ROM), flash memory, or other types of volatile and/or non-volatile memory. The memory 210 generally includes program code for performing various functions related to use of the mask synthesis server 200. The program code is generally described as various functional "applications" or "services" within the memory 210, although alternate implementations may have different functions and/or combinations of functions.

Within the memory 210, an ILT service 212 facilitates using ILT to synthesize masks from design patterns. For example, as discussed above at block 104 illustrated in FIG. 1, the ILT service 212 can use ILT to synthesize masks for use in training an ML model. The memory 210 further includes an ML training service 214. In an embodiment, the ML training service 214 can be used to train an ML model, as discussed above in relation to block 108 in FIG. 1 (e.g., using training data masks 106 and design patterns 102). The memory 210 further includes an ML inference service 216. In an embodiment, the ML inference service 216 can be used to synthesize a mask (e.g., from design patterns) using a trained ML model (e.g., the ML model 110 illustrated in FIG. 1). This is discussed further below with regard to FIG. 8 and other Figures.

Figure 3:
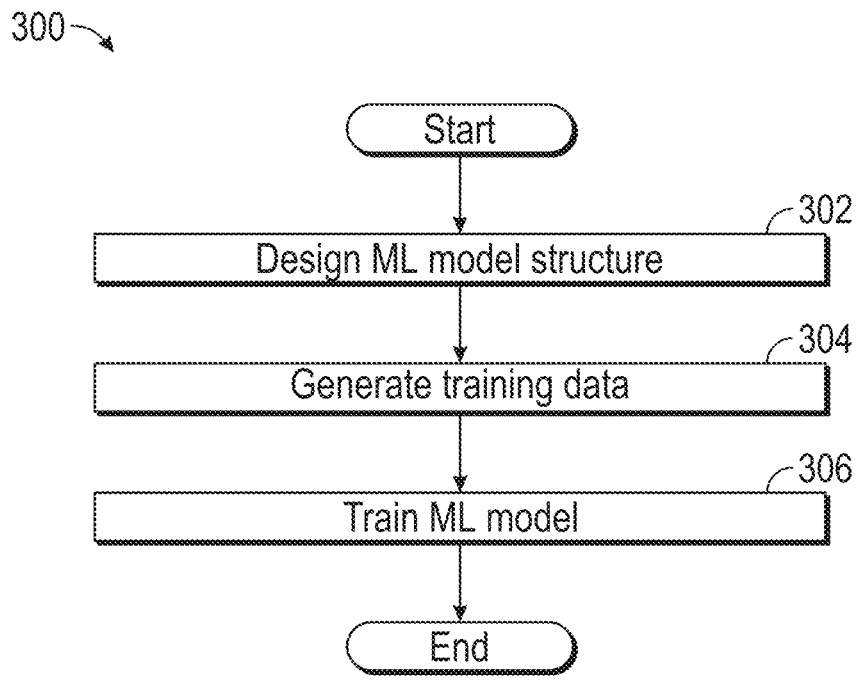
FIG. 3 is a further flowchart for using ILT to train an ML model for mask synthesis, according to an embodiment.

FIG. 3 is a further flowchart 300 for using ILT to train an ML model for mask synthesis, according to an embodiment. At block 302, the structure for the ML model is designed. This is discussed further with regard to FIG. 4, below. In an embodiment, the ML model structure can be a combination of typical ML layers, including convolution layers, densely connected layers, nonlinear activation functions, etc. The model can have multiple hidden layers (e.g., a deep model). Further, the model can use a gradient based optimization scheme such as stochastic gradient descent (SGD), or variants of SGD, to converge to a model which fits the data well enough to use for inferencing after training and produce acceptable results which resemble the training masks which came from ILT as closely as possible.

In an embodiment, models developed for signal processing applications, such as image recognition, can be used as a baseline to design a suitable ML model structure. In this embodiment, input data polygons (e.g., included in the design patterns 102 illustrated in FIG. 1) and training mask polygons (e.g., the training data masks 106 illustrated in FIG. 1) can be transformed into image-like objects by rasterizing them prior to handing them off to the ML model training step.

Further, in an embodiment, models developed for image recognition can be improved by recognizing, and compensating for, a number of characteristics of lithographic masks. For example, a model can be designed for translational invariance, model grid shift invariance, and symmetry. This is discussed further with regard to FIGS. 4-7, below.

At block 304 an ML training service (e.g., the ML training service 214 illustrated in FIG. 2) generates training data. For example, as discussed above in relation to block 104 illustrated in FIG. 1, ILT techniques can be used to generate training data. In an embodiment, training data can be pre-cleaned-up (e.g., prior to use in training the ML model) to correct for grid-alignment issues, lack of symmetry, and other potential issues. For example, training data generated using ILT may be sensitive to grid alignment issues (e.g., shift invariance, as discussed below in relation to block 404 illustrated in FIG. 4) and lack of symmetry in output masks (e.g., as discussed below in relation to block 406 illustrated in FIG. 4). Using ML architectures to enforce symmetry in the output, when the training data itself shows poor symmetry, can result in poor calibration. Similarly, an ML model may have issues if multiple instances of the same design in the training data set have very different outputs (e.g., due to grid alignment issues).

Symmetry issues (e.g., symmetric behavior in inputs that is not carried over to the output) can be improved in several ways. For example, the ML training service can identify repeated and symmetric inputs and algorithmically enforce them to have identical solutions up to the transform found. In an embodiment, this can be done by identifying repeated chip design regions that are identical within a window, synthesizing the mask for these designs and storing it in a library, and then using the library as a look up table for the mask when full chip mask synthesis is done. This is merely one example, and other suitable techniques can be used. In this example, the library can be created for a particular design being processed, or it can exist as a database of solutions from multiple designs. This can improve symmetry by ensuring that identical placements of design geometry will result in identical masks and any design symmetry locally detected will be enforced on the mask.

In an embodiment, this can be one using the following sequence of steps: First, a full chip design or representative set of test patterns is read. Second, the user places a user defined search window at selectively defined search box centers. The technique of choosing these centers can be guided by within template design hierarchy or by heuristically based sparse sampling of the design chosen so the number of searches is not overwhelming. Third, for each search box, a suitable software service (e.g., ML training service 214 illustrated in FIG. 2) clips the design to that box and then calculates a hash key or other signature of the geometry. Fourth, the service uses the hash key to index the design pattern into a dictionary that stores the clipped geometry. Fifth, after the clips are found, it can then be determined which clips are repeated modulo translation and symmetry operations, so that a subset of the clips which represent the unique clips can be chosen. The service performs mask synthesis on the unique patterns (including symmetry detection and enforcement on the clip, as described above) and stores the solution in a suitable database (e.g., a global solution database). Sixth, when solving mask synthesis on the same design or a new chip design, the service uses the same searching/hashing technique to find locations that have mask solutions already stored in the global database. The service places the masks into those locations as appropriate, and performs blending to produce a lithographically optimized mask. The result of the preceding steps is a mask which is globally consistent and symmetric at all locations. After the training data has been symmetrized and made consistent, the ML training service can transform the polygon to a pixelized domain using rasterization (e.g., as discussed further below). Alternatively, or in addition, pixelized representations of polygons can be generated by first converting the polygons to a skeleton representation, and then converting the skeleton representation to pixelized data (e.g., focusing on the axis of the mask polygons). This is illustrated further below with regard to FIG. 9F.

At block 306, the ML training service trains the ML model. In an embodiment, the ML training service takes as input both training data masks generated using ILT and underlying design patterns. Further, in an embodiment, these training data masks and the design patterns are pre-processed (e.g., converted to a pixel domain or another suitable domain, and processed as described above in relation to block 304). Standard ML training techniques can then be used to train the ML model using the input data.

Figure 4:
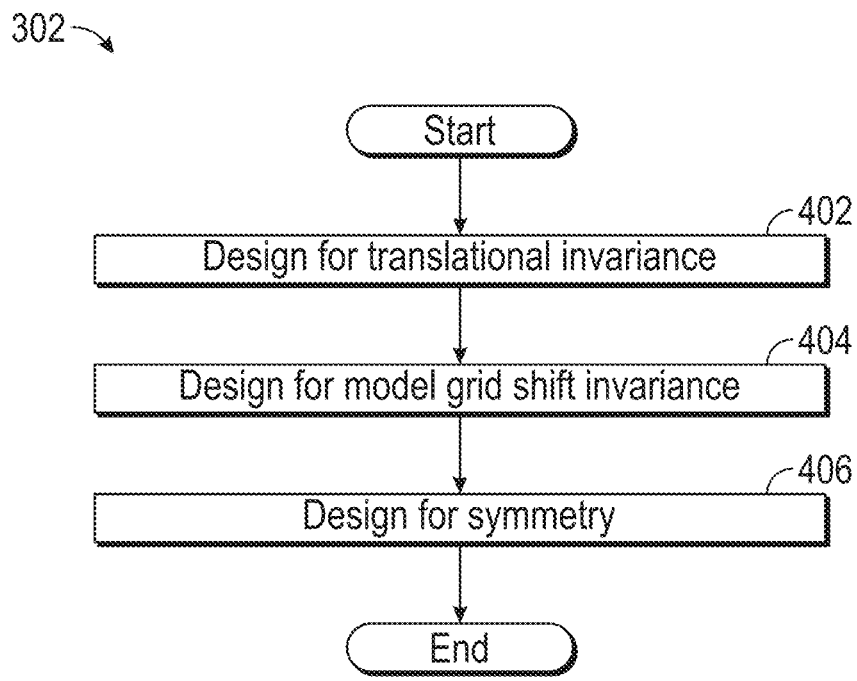
FIG. 4 is a flowchart for determining ML model structure for using an ML model for mask synthesis, according to one embodiment.

FIG. 4 is a flowchart for determining ML model structure for using an ML model for mask synthesis, according to one embodiment. In an embodiment, FIG. 4 corresponds with block 302 illustrated in FIG. 3. As discussed above, in an embodiment, polygons in masks (e.g., in design patterns 102 and training data masks 106 illustrated in FIG. 1) are converted to a pixel domain for use in training an ML model (e.g., through rasterization). This pixelization, however, can create errors (e.g., from aliasing). For example, a polygon that appears in multiple places in a design pattern should be represented identically in each place, in a synthesized mask. Because of errors, however, the same polygon may be represented differently in different parts of a pixelized representation of a design pattern. The ML model can be designed to compensate for these errors.

At block 402, the ML model is designed for translational invariance (e.g., ensuring that the polygons remain consistent when translated across a grid). Most mask synthesis results are expected to exhibit translational consistency. That is, as long as the lithography system has some translational invariance at some scale then the mask synthesis result will also be expected to exhibit this invariance. Typical translational invariance would be expected as long as the design pattern polygons are translated farther than the lithography system ambit. For example, for a 193 nm system, this would be expected to be in the range of ~1 micron. In an embodiment, the ML model is designed for translational invariance. This is discussed further with regard to FIGS. 5A-B, below.

Figure 5A:
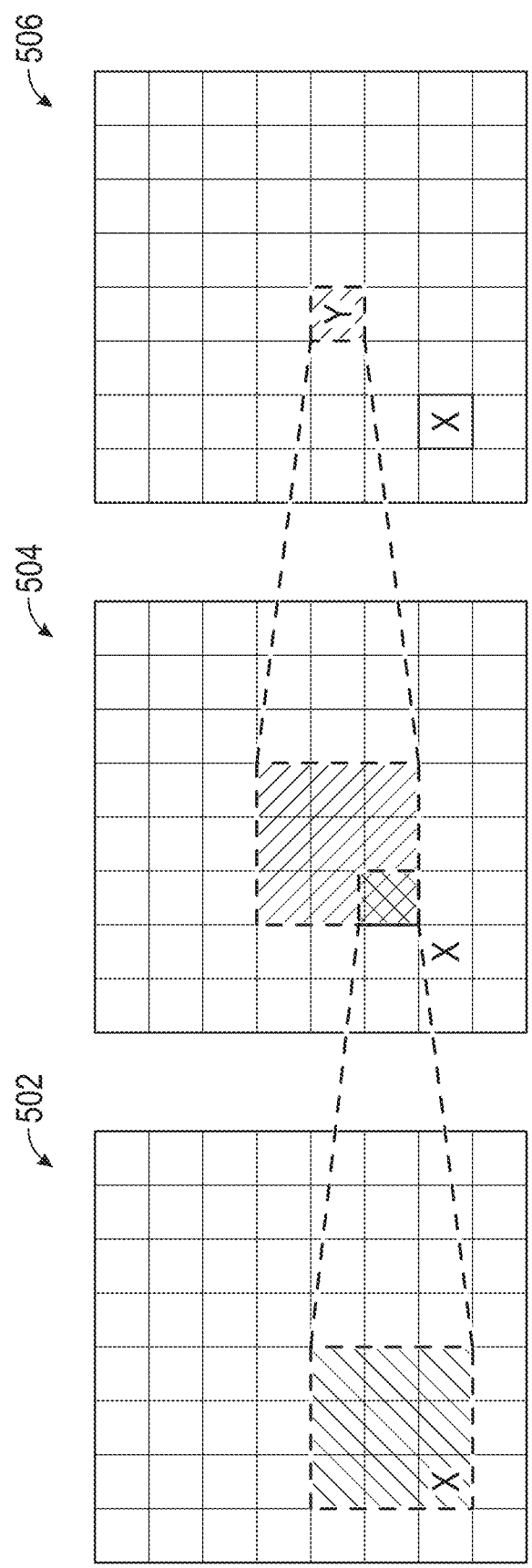
FIG. 5A illustrates translational invariance in an ML model for mask synthesis, according to one embodiment.
Figure 5B:
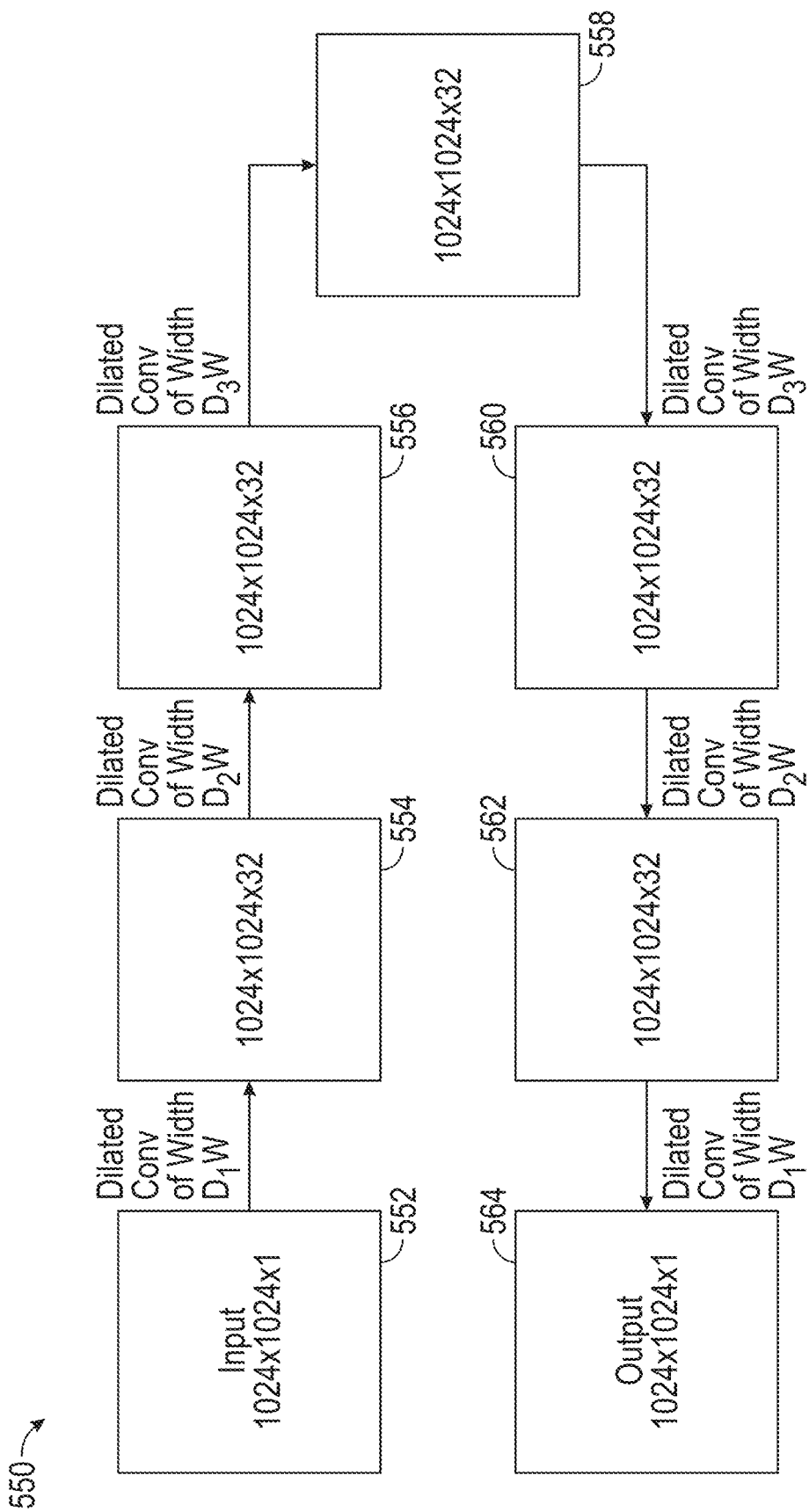
FIG. 5B illustrates a translationally invariant ML model structure for mask synthesis, according to one embodiment.

While translational invariance, as discussed with relation to FIGS. 5A-B, is a factor in many systems, some systems (e.g., extreme ultraviolet (EUV) lithography) would be expected to exhibit different, or perhaps no, translational consistency. In these systems other longer-range effects (e.g., flare or illumination angle) can impact the solution at scales much larger than a micron. For example, flare or slit angle can be a significant factor in EUV lithography.

At block 404, the ML model is designed for model grid shift invariance. In an embodiment, this includes ensuring that input data and training data (e.g., design polygons or a representation of them), for the ML model, are grid shift invariant. For example, the input data, the training data, or both, can be represented using a non-pixelated representation (e.g., using offset distances from the edges of the polygon). This is discussed further with regard to FIGS. 6A and 9C, below.

Alternatively, or in addition, designing the ML model for model shift grid invariance includes ensuring that design polygons do not shift when the grid used in ML uses larger units than the design polygon input. In an embodiment, the ML models are further designed to reduce or eliminate grid or pixel shift variance (SV). This type of SV can be found when there is an underlying input to the model which has finer units than the pixelated grid which is used for the convolutions. For the mask synthesis application, design polygons are often stored on a database unit of less than 1 nm, while the pixelized grid has a spatial pixel size of multiple nanometers for practical purposes. In an embodiment, the ML model is designed for model grid shift invariance. This is discussed further with regard to FIGS. 6A-B, below.

At block 406, the ML model is designed for symmetry (e.g., as discussed above ensuring that symmetry in design polygon inputs carries through to outputs). In an embodiment, a photolithography system typically has some symmetric behavior based on the illumination source shape. A user will expect that the resulting mask synthesis solution will also exhibit these symmetries. In an embodiment, the ML model is designed to enforce symmetry specified by the user. This is discussed further with regard to FIGS. 7A-B, below.

FIG. 5A illustrates translational invariance in an ML model for mask synthesis, according to one embodiment. In an embodiment FIGS. 5A-B correspond with block 402 illustrated in FIG. 4. One possible source of error in an ML model is that repeated convolutions can make a single pixel (e.g., in a pixelized design pattern) have a large influence on an output synthesized mask. (e.g., because the area of influence of the pixel can change with repeated convolutions) In an embodiment, this can be addressed in the ML model structure by limiting the model ambit (e.g., the effect of one portion of an input throughout convolutions) to less than a specific pre-defined value. This can be done by ensuring that the longest-range effect that a model can have, given a change in any input value, is geometrically limited. This helps ensure that a part of the design in one location should not impact another portion of the design from which it is optically isolated during etching. For deep convolutional neural networks (CNN), this is done by limiting the convolutional kernel dilations, widths, and depth, as well as limiting other operations which effectively increase them model ambit, such as down sampling to a coarser pixel representation.

For example, FIG. 5A illustrates a sequence of 3×3 convolutions applied left to right. An input signal at the pixel marked X, in grids 502, 504, and 506, can have an influence on an output signal marked y in grid 506. For example, grid 502 illustrates the initial position of the pixel X. Grid 504 illustrates the area influence of the pixel X after an initial convolution (or series of convolutions). Grid 506 illustrates the area of influence of the pixel X after another convolution (or series of convolutions). Because of repeated convolutions, the value at pixel X in grid 502 can incorrectly affect the value at pixel Y in grid 506, creating errors. Further, if the kernel width and depth in the ML model is increased (e.g., increasing the change in potential influence across convolutions), then the pixel X could potentially affect all the pixels in the domain, which could violate translational invariance (e.g., by failing to ensure that the polygons remain consistent when translated across a grid) and create further errors.

FIG. 5B illustrates an example translationally invariant ML model structure 550 for mask synthesis, according to one embodiment. The illustrated ML model structure 550 includes a number of layers 552, 554, 556, 558, 560, 562, and 564. The ML model structure further includes dilated convolutions, labeled as "Dilated cony."

The dimensions each layer are listed in the relevant box as N×N×K where the pixel dimensions, N, are the first two indices and the number of pixelized fields, or channels, is the third index, K. For example, the layer 552 includes pixel dimensions of 1024×1024 and 1 pixelized field. The layer 554 includes pixel dimension of 1024×1024 and 32 pixelized fields. Convolutions on inputs with multiple channels can be three dimensional, convolving over the N×N pixelized domain as well as through all the channels at the same time. Convolution kernel sizes are denoted by ci and co, the number of input and output channels, respectively, between any two boxes in the figure. To get an output with multiple channels, we can create a convolution kernel of shape ci×N×N for every output channel. We concatenate them on the output channel dimension, so that the shape of the convolution kernel is co×ci×N×N. Thus, the number of convolutions, with activation functions applied to their output, between each layer in FIG. 5B is determined by the number of pixelized layers in the input and destination layers. Each convolution can potentially be followed by a batch normalization and activation function such as tanh, sigmoid etc. The illustrated choices of model depth, kernel dimensions, image dimensions, and model layer connectivity are shown for example purposes only, and any suitable parameters can be used.

In an embodiment, dilated convolutions are used to allow larger convolutional range than traditional convolution functions. The depth of the network (e.g., the number of convolution steps from left to right), is limited so that the total ambit of the model in terms of maximal extent of the influence of any pixel in the input to another pixel in the inferenced result is finite and limited to a value which comparable to the physical ambit of the lithography system. A typical way to grow the model ambit is by using larger convolution kernels or having a network with large depth (allowing cumulative additions of kernel ambits).

However, both these options result in larger turn around time and more complex networks. In an embodiment, dilated kernels are very beneficial. Dilated kernels allow for increased model ambit (larger convolutional range) without incurring the turn around time penalty. The ambit of the model can be computed by using the model depths, kernel dilation factors: {Di}, and the undilated kernel widths, w. Given a target model maximal ambit, A, one can compute various combinations of depth, kernel width, and kernel dilation factors so that the total model ambit is less than the target ambit A. In an embodiment, each dilated convolution includes a kernel dilation factor greater than 1.

Figure 6A:
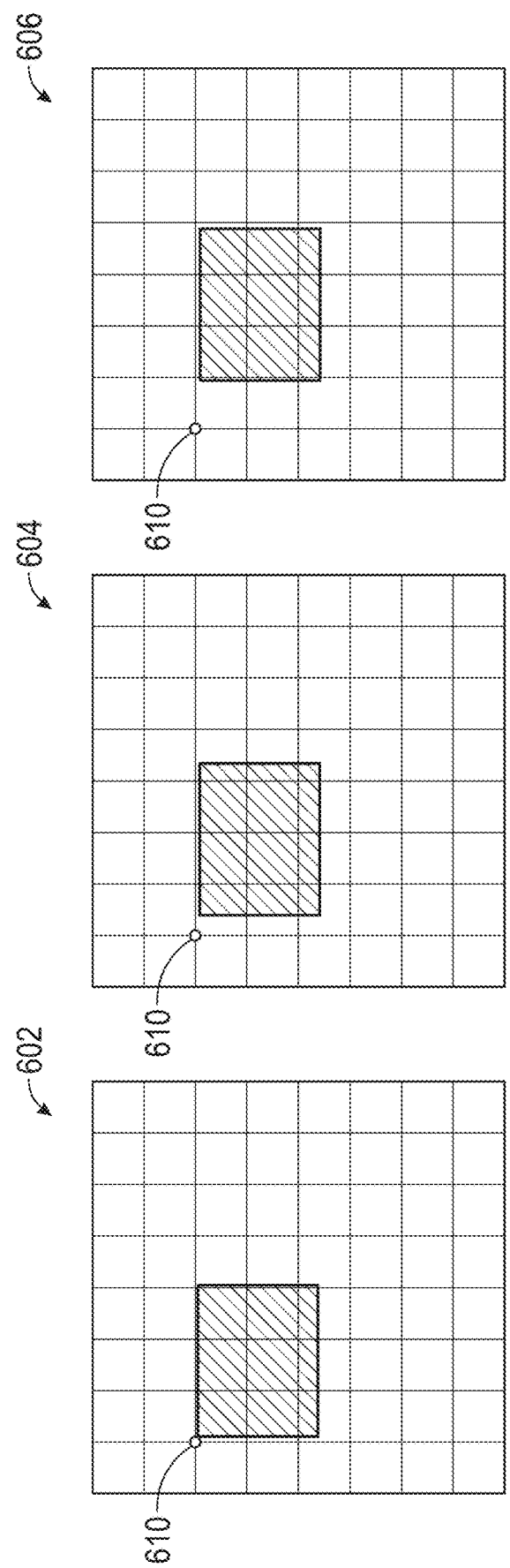
FIG. 6A illustrates model grid shift invariance in an ML model for mask synthesis, according to one embodiment.

FIG. 6A illustrates model grid shift invariance in an ML model for mask synthesis, according to one embodiment. In an embodiment FIGS. 6A-B correspond with block 404 illustrated in FIG. 4. FIG. 6A illustrates a polygon rectangle which has offsets in the sub-grid size database unit, from the dot 610 which is fixed at a pixel corner. Many ML models are overly sensitive and magnify the SV noise, limiting the tool's effectiveness. This can be a significant problem. One solution is to use more training data and provide multiple versions of the layout at different grid locations, to allow ML model to "learn" the different configuration. This is illustrated in FIG. 6A, in which multiple versions of a layout, at different grid locations, are presented at illustrations 602, 604, and 606. This approach has drawbacks, however, including a larger turn around time and generating significantly more training data.

Alternatively, or in addition, model grid shift invariance can be addressed by predicting the output, irrespective of its grid alignment, using limited grid alignments in the input (and without bloating up the training data set). This can be done by making sure the input data and training data (e.g., the design polygons or a representation of them), are themselves grid shift invariant. One way to achieve this is to avoid using pixelized representation of design polygons, at all. For example the design polygons can be represented by offsets from an edge, instead of a pixelized representation. A neural network can be configured to receive, as input, features describing the circuit design within a neighborhood of an input location, and to output an offset distance from an edge of a circuit design polygon. The neural network can be used to determine offset distances for locations associated with circuit design polygons. For example, the system may select locations along the edges of a circuit design polygon and generate offset distances from the edges of the polygon (e.g., as illustrated in FIG. 9C, below). The system generates mask design polygons based on the offset distances. The mask design polygon may represent a feature corresponding to the circuit design polygon, for example, a main feature or an assist feature. The system generates a mask design for the circuit design using the mask design polygons. However, given the widespread usage, study, and success of CNNs for pixelated inputs, it is also desirable to handle pixilation/rasterization of the input polygons.

To prepare the polygons for usage in CNNs, they can be transformed to a pixelized domain. For example, "subresolution-pixel" or "sub-pixel" sampling (SPS), wherein an input image is first rendered into a high-density pixel grid, which is subsequently converted to a desired lower resolution grid by sampling with a finite impulse response (FIR) filter, can be used. As another example, "flash"-based techniques can be used. For example, a flash-based technique is used to compute two-dimensional convolution values for a plurality of query points on the edges of a pattern layout. The flash-based technique precomputes (through numerical integration) the convolutions of a set of basis functions with one or more model kernels that represents the optical lithography system behavior. For example, the set of basis functions can be a set of half-plane basis functions that correspond to a set of predetermined face angles (e.g., a 45° face angle, a 90° face angle, a 135° face angle, etc). Each of the half-plane basis functions divides a two-dimensional space into two regions. The convolution values evaluated at an array of predetermined pixel locations are then stored in a set of two-dimensional lookup tables, referred to as model flash lookup tables.

In an embodiment, a system decomposes a polygon pattern into a flash representation, where each flash in the flash representation is an instance of one of the set of basis functions (e.g., half-plane basis functions as described above). The system then creates a sampled pattern layout by establishing a sampling grid over the polygon pattern layout. Next, at each grid location in the sampling grid, the system computes a convolution value (i.e., a filtered value) between an anti-aliasing filter (AAF) kernel (e.g., filter) and the input pattern layout (e.g., using a lookup table) The system stores the convolution value at the grid location in the sampling grid. The system repeats the final two steps for the entire sampling grid, to obtain a pixelized sampled image which is usable by CNNs. Additional techniques are discussed in relation to FIG. 6B, below.

Figure 6B:
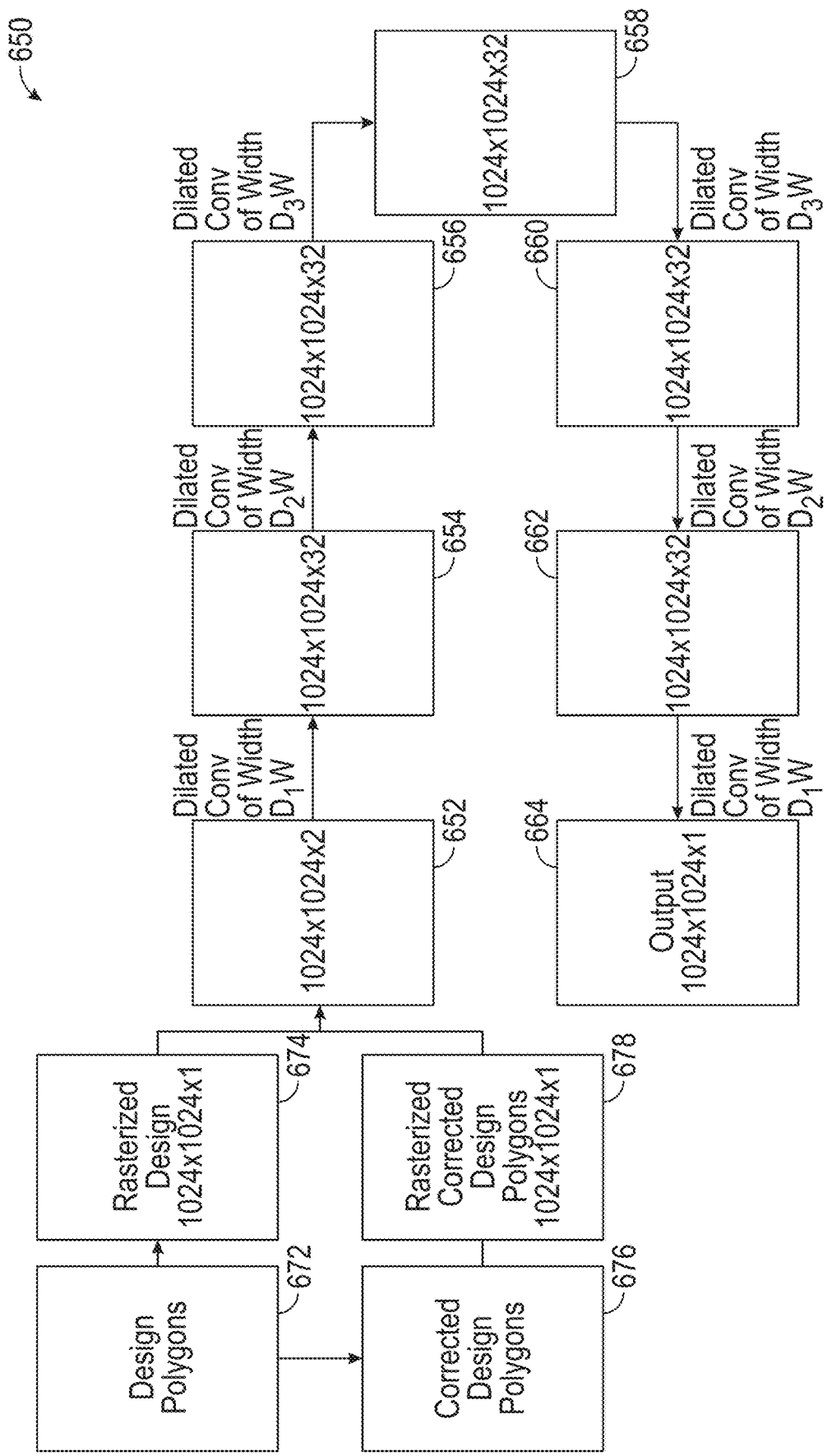
FIG. 6B illustrates a model grid shift invariant ML model structure for mask synthesis, according to one embodiment.

FIG. 6B illustrates a model grid shift invariant ML model structure 650 mask synthesis, according to one embodiment. In an embodiment, the ML model structure 650 includes a number of layers 652, 654, 656, 658, 660, 662, and 664, similar to the ML model structure 550 illustrated in FIG. 5B. Like the ML model structure 550 in FIG. 5B, the ML model structure 650 illustrated in FIG. 6B further includes dilated convolutions, labeled as "Dilated cony," and the dimensions each layer are listed in the relevant box as N×N×K where the pixel dimensions, N, are the first two indices and the number of pixelized fields is the third index, K. Each convolution can potentially be followed by a batch normalization and activation function such as tanh, sigmoid etc. The illustrated choices of model depth, kernel dimensions, image dimensions, and model layer connectivity are shown for example purposes only, and any suitable parameters can be used.

In an embodiment, the input to the ML model layer 652 can be used for model grid shift invariance. For example, in one embodiment the ML model layer 652 receives as input only rasterized design polygons 674. In another embodiment, the model grid shift invariance can be improved by providing rasterized design polygons 674 as one input to the layer 652, along with a second input: lithography simulation of the design polygons using the design polygons as the mask (e.g., with dimensions 1024×1024×1).

In another embodiment, rasterized design polygons 674 are provided as one input to the layer 652, along with a different second input: a rasterized version of corrected design polygons. This is illustrated in FIG. 6B. Design polygons 672 are rasterized, and the rasterized design polygons 674 are provided as input to the layer 652. In addition, the design polygons are corrected using known techniques (e.g., optical proximity correction (OPC) to generate corrected design polygons 676. The corrected design polygons 676 are rasterized, and rasterized corrected design polygons 678 are also provided as an input to the layer 652.

In another embodiment, rasterized corrected design polygons 678 are replaced with a lithography simulation of the corrected design polygons using the corrected design polygons as the mask (e.g., with dimensions 1024×1024×1). Design polygons 672 are rasterized, and the rasterized design polygons 674 are provided as input to the layer 652. In addition, the design polygons are corrected using known techniques (e.g., optical proximity correction (OPC) to generate corrected design polygons 676. The corrected design polygons are treated as though they were the mask, and used in a lithography simulation. The simulated mask, based on the corrected polygons, is provided as a second input to the layer 652 (e.g., in place of the rasterized corrected design polygons 678 illustrated in FIG. 6B).

In another embodiment, a level-set function of the design polygons (e.g., with dimensions 1024×1024×1) is provided as a second input to the layer 652, along with the rasterized design 674. In another embodiment, an ML architecture with different resolutions for input and output fields can be used. For example, the input can be a coarse bandlimited target or aerial image field, whereas the output can be a finer rasterized field (e.g., with dimensions 2048×2048×1), with upsampling convolution between the layer 664 and the finer output.

In an embodiment, model grid shift invariance can be further improved by eliminating, or modifying, model terms or functions which potentially have high pixel placement sensitivity. Terms which select the value of a single pixel from a group of pixels tend to magnify the SV, for example maximum selection over a range of pixels or down sampling by choosing a single pixel value from a group of pixels (e.g., a max pooling function and a subsampling (down sampling) function). These can be avoided. This also extends to methods such as strided convolutions. In an embodiment, using dilated convolutions to expand the model convolution ambit, as opposed to using strided convolutions, results in significantly improved performance. In summary, the ML model structure is designed to carefully reduced the highly non-linear and aliasing inducing terms, so that the model has smooth response (thereby improving the grid sensitivity), while still allowing the model to encapsulate the complex non-linear functional representation required for predicting an ILT mask for a given design.

Figure 7B:
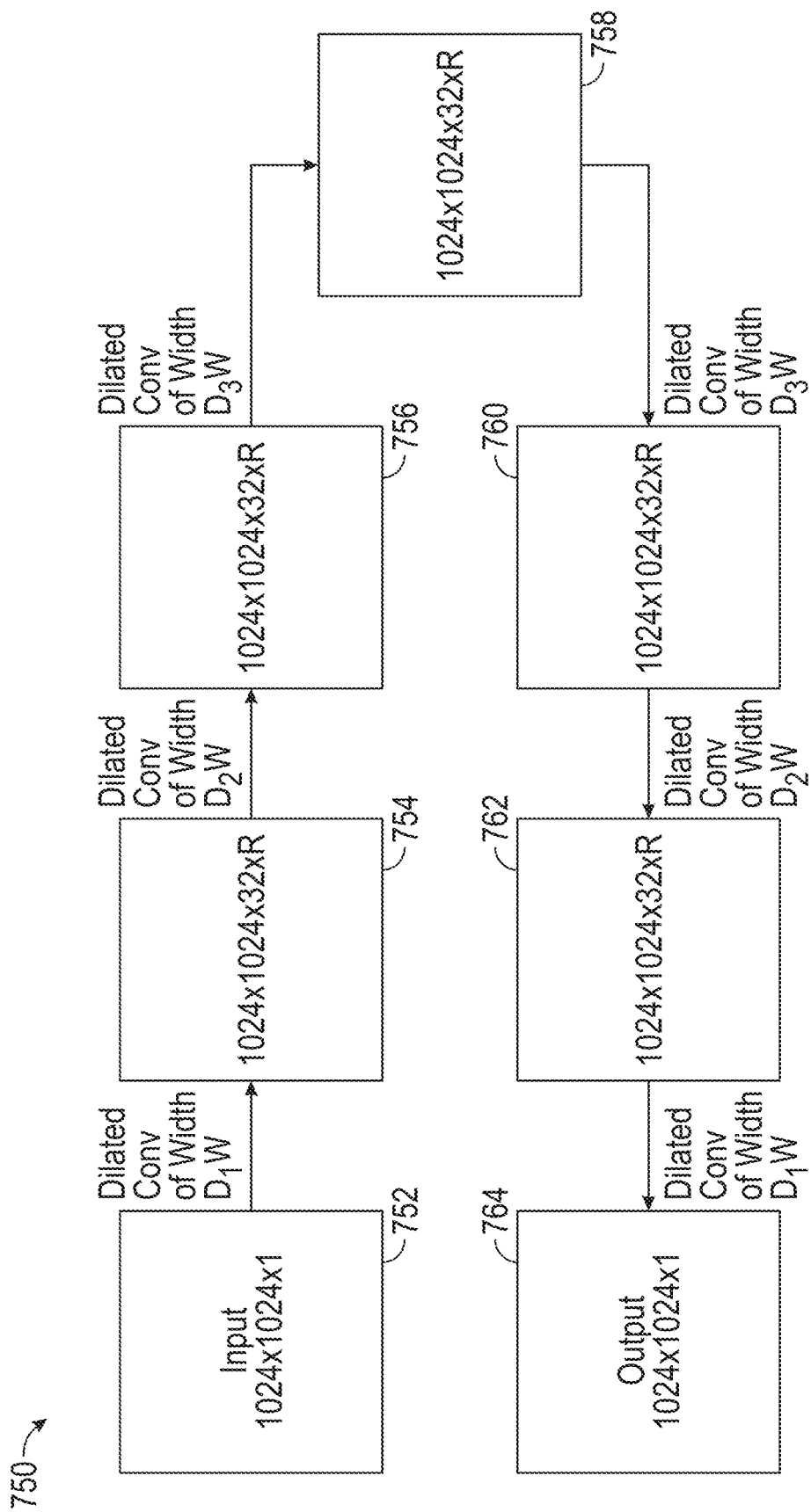
FIG. 7B illustrates a symmetric ML model structure for mask synthesis, according to one embodiment.

FIG. 7A illustrates symmetry in an ML model for mask synthesis, according to one embodiment. In an embodiment FIGS. 7A-B correspond with block 406 illustrated in FIG. 4. In an embodiment, specific symmetry groups have been defined in the art (e.g., a group of transformations under which an object is invariant). These include a full symmetry group, a proper symmetry group, a rotation group, a discrete symmetry group (e.g., a finite point group, an infinite lattice group, and an infinite space group), and continuous symmetry groups. For any of these groups we have a finite set of operations, $R=\{R_i\}$, from a starting orientation, which produce all the other members in the group. This collection of operations defines the operations we expect our ML model to be invariant under.

In an embodiment, the ML model can be designed to be invariant under these transformations by ensuring that operations in the model architecture are invariant. This can be done, for example, by applying the operations in R to each operation in the model architecture. For convolutions this means replicating a convolution kernel, $K_j$, by $R_i(K_j)$ for all $R_i$ in R.

FIG. 7A illustrates an example of how a convolution kernel, labeled F, is applied and how its 90-degree rotated versions look. In an embodiment, the illustration 706 shows 90-degree rotated versions of the convolution kernel F in illustration 702. The result of the convolutions at pixel x, in illustration 704, is the sum of the contributions from the four rotated kernels added together.

FIG. 7B illustrates an ML model structure 750 that compensates for symmetry for mask synthesis, according to one embodiment. In an embodiment, the ML model structure 750 includes a number of layers 752, 754, 756, 758, 760, 762, and 764, similar to the ML model structure 550 illustrated in FIG. 5B. Like the ML model structure 550 in FIG. 5B, the ML model structure 750 illustrated in FIG. 7B further includes dilated convolutions, labeled as "Dilated cony," and the dimensions each layer are listed in the relevant box as N×N×K where the pixel dimensions, N, are the first two indices and the number of pixelized fields is the third index, K. Each convolution can potentially be followed by a batch normalization and activation function such as tan h, sigmoid etc. The illustrated choices of model depth, kernel dimensions, image dimensions, and model layer connectivity are shown for example purposes only, and any suitable parameters can be used.

In an embodiment, the ML model structure 750 further includes the R mirrored, or rotated, versions of the convolution (e.g., as illustrated in FIG. 7A). This is included as "R" in the model layers 754, 756, 758, 760, and 762. Alternatively, or in addition, the "R" version of the kernel can be combined prior to applying the activation function, to reduce the applied kernel count by a factor of R.

Figure 8:
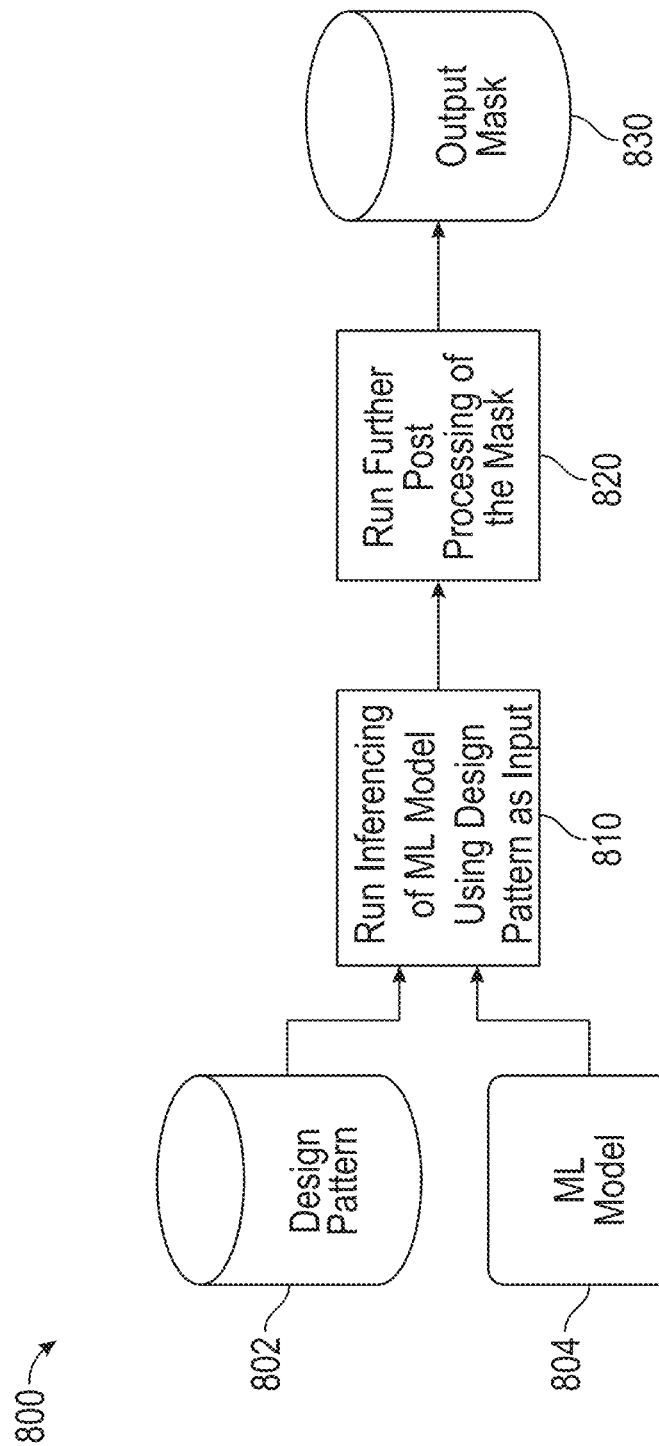
FIG. 8 is a flowchart for using an ML model to infer mask synthesis, according to an embodiment.

FIG. 8 is a flowchart 800 for using an ML model to infer mask synthesis, according to an embodiment. A design pattern 802 (e.g., one or more polygons) and an ML model 804 (e.g., the ML model trained at block 108 in FIG. 1 and block 306 in FIG. 3) are provided to block 810. At block 810, an ML inference service (e.g., the ML inference service 216 illustrated in FIG. 2) uses the ML model 804 to infer a synthesized mask from the design pattern 802. In an embodiment, the design pattern 802 can be transformed in any suitable fashion (e.g., pixelized, transformed to a level-set domain, etc.) as discussed above.

At block 820, the ML inference service (or any other suitable service) runs further post-processing on the mask generated at block 810. In an embodiment, the service can post-process the mask to enhance the lithography performance of the mask, and fix any artifacts or other areas where the inferenced solution was not accurate enough. This post processing could be any combination of rule-based correction, model-based edge perturbations, application of additional ML models, etc. The service generates the output mask 830.

In an embodiment, the output mask 830 is a data type that is not suitable for use with typical lithography tools. For example, the output mask 830 could be pixelized, in a level-set domain, etc. The output mask 830 can be converted to a data type suitable for native use by lithography tools (e.g., polygons). This is discussed further with regard to FIGS. 9A-F.

Figure 9A:
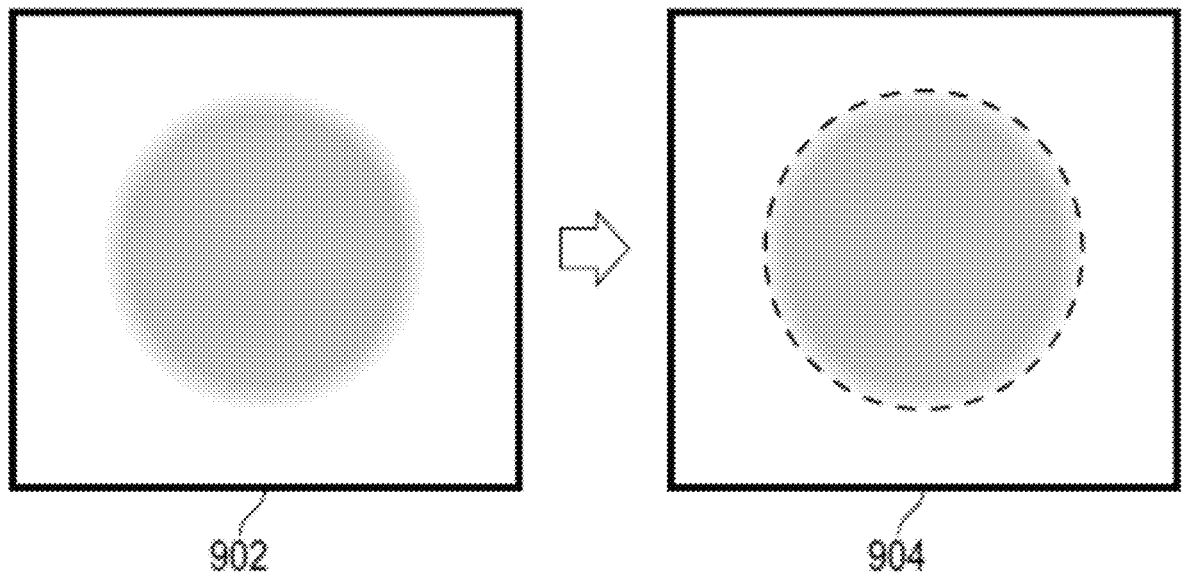
FIGS. 9A-F illustrate converting a mask generated through inference by an ML model for use by lithography tools, according to an embodiment.
Figure 9B:
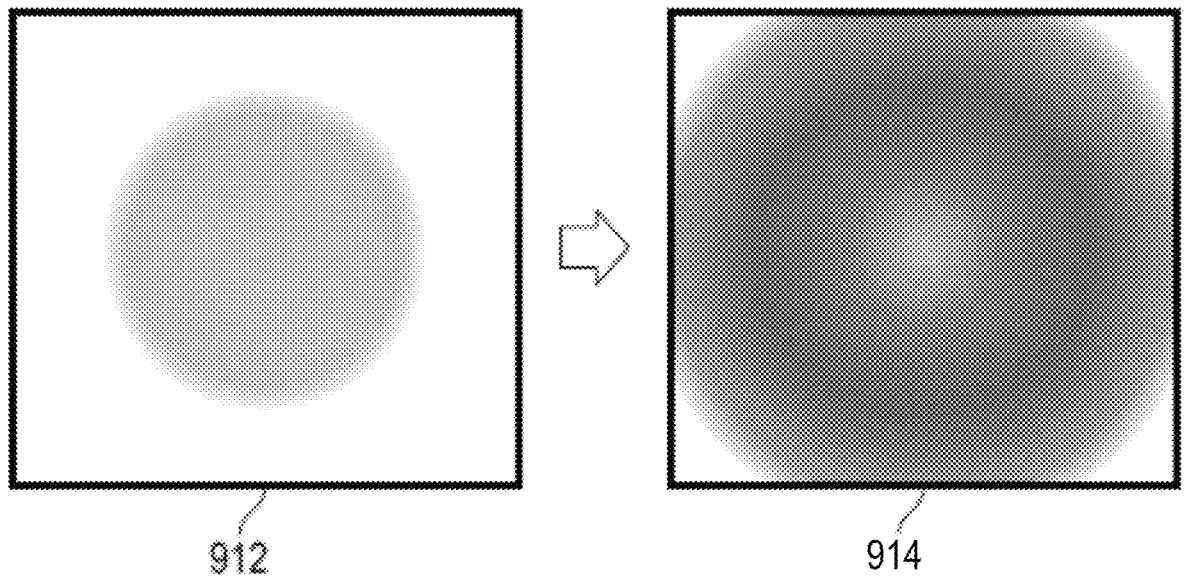
Figure 9C:
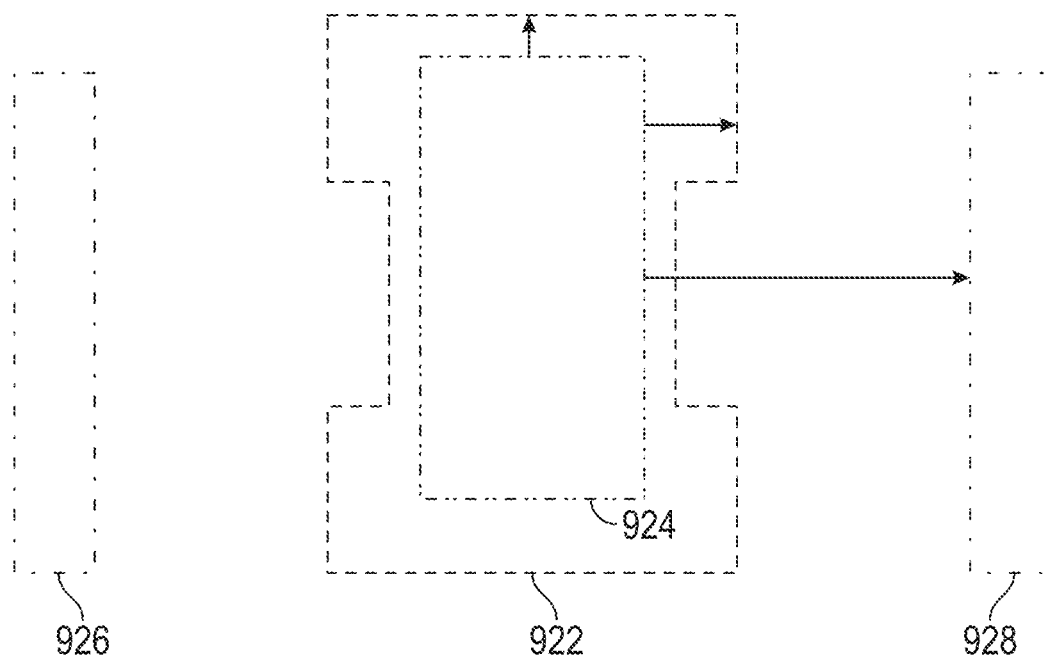

FIGS. 9A-F illustrate converting a mask generated through inference by an ML model for use by lithography tools, according to an embodiment. FIG. 9A illustrates converting a pixelized mask to a polygon format, according to an embodiment. A pixelized mask 902, output by an ML model inferencing step, is contoured at an appropriate height, between the maximum and minimum values produced by the inferencing on the field. This produces all angle polygons, illustrated in polygon mask 904. The all angle polygons are a data type which lithography tools can consume.

FIG. 9B illustrates converting a pixelized mask to a level-set format, according to an embodiment. A pixelized mask 912, output by an ML model, is converted to a level-set field 914, as discussed above. In an embodiment, the level-set field representation of the mask can be used by lithography tools.

FIG. 9C illustrates converting an output mask into offsets from a design edge, according to an embodiment. A polygon 922 represents the main feature mask edge, offset from the design polygon 924. Assist feature polygons 926 and 928 are also offset from the design polygon 924.

Figure 9D:
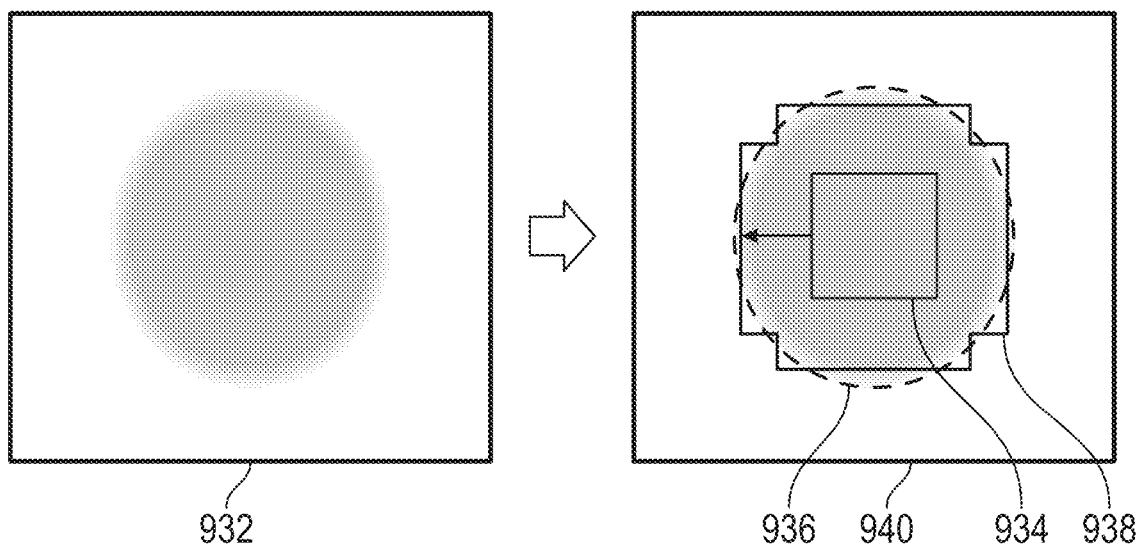

In an embodiment, offsets from a design edge (as illustrated in FIG. 9C) can be constructed by first contouring the field and then computing the offsets from the design edge of the contour. This is illustrated in FIG. 9D, according to an embodiment. An output mask 932 is used to generate a converted mask 940, which includes a design polygon 934, a contoured inference field 936 (illustrated with dashed lines), and an offset final mask 938.

Figure 9E:
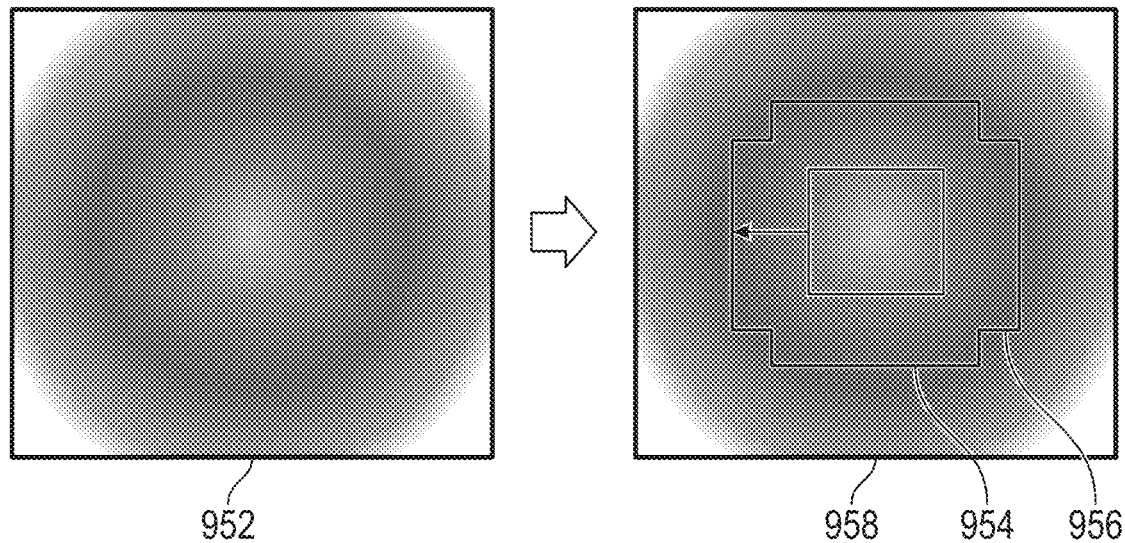

Alternatively, or in addition, offsets from a design edge (as illustrated in FIG. 9C) can be constructed using geometric transforms on a level-set representation of the ML model output mask. This is illustrated in FIG. 9E, according to an embodiment. An output mask 952 from an ML model is represented as a level-set function. Direct sampling from the level-set function can be used to generate a converted mask 958, which includes a design polygon 954 and an offset final mask 956.

Figure 9F:
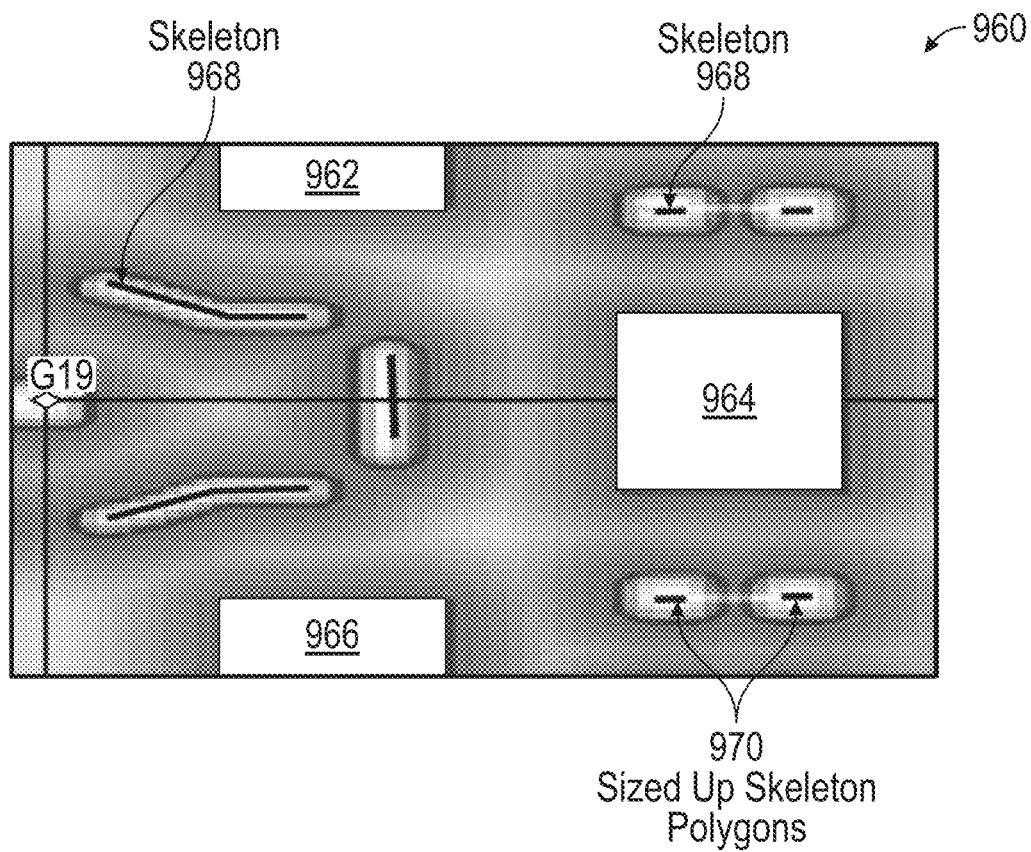

FIG. 9F illustrates using skeletons to generate polygons from an output mask, according to an embodiment. A skeleton representation 960 of an output mask includes design polygons 962, 964, and 966, along with skeletons 968 and sized up skeletons 970. In an embodiment, the skeleton representations can be processed by mask synthesis algorithms, directly prior to being sized up to be polygons. The extraction of these skeletons can be done by searching for local extrema of the inferenced field or other methods which attempt to find the most important 1d-skeleton regions of the field where mask features should be placed.

Figure 10:
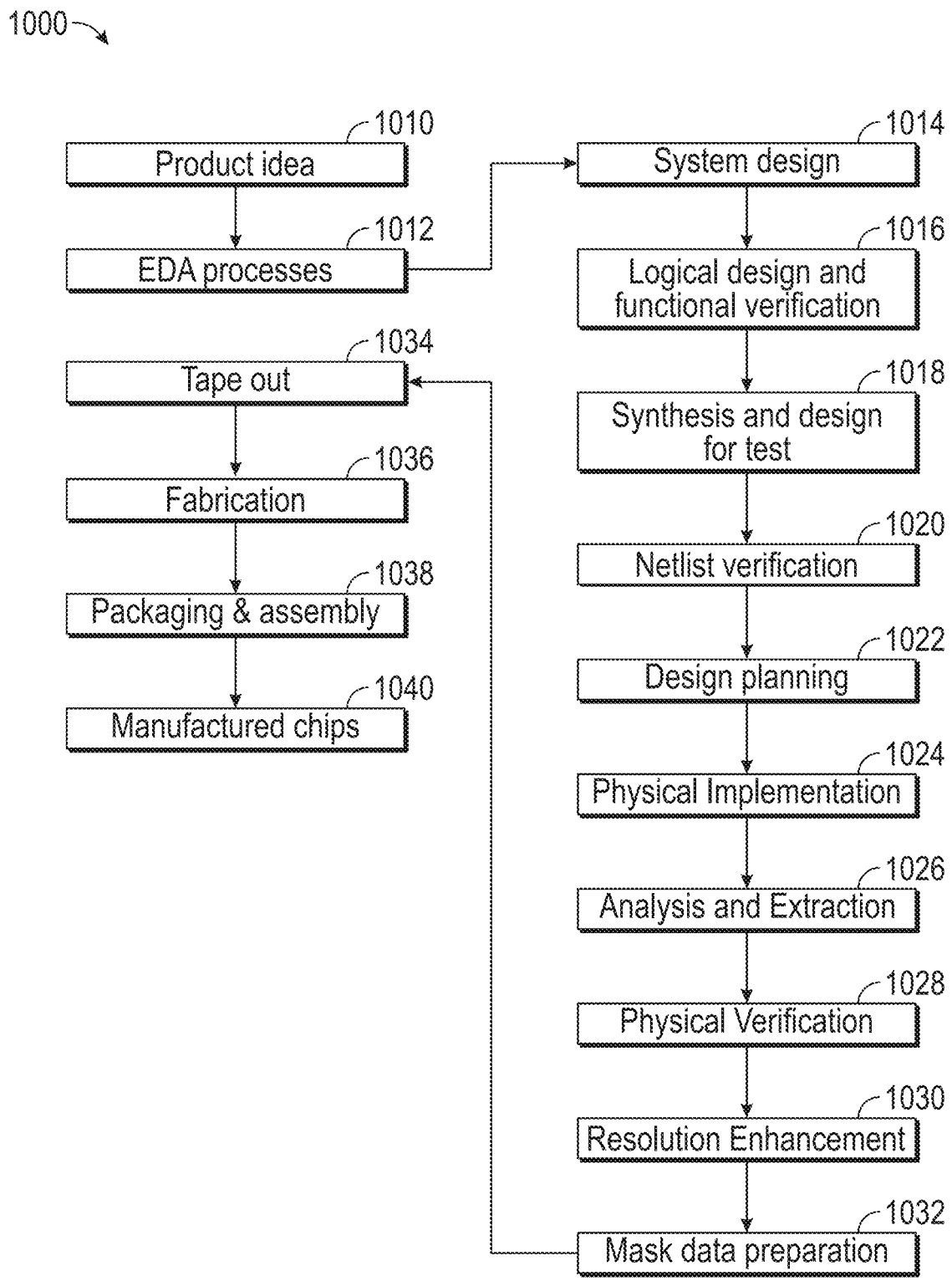
FIG. 10 is a flowchart of various operations in the design and fabrication of an integrated circuit, according to one embodiment.

FIG. 10 is a flowchart of various operations in the design and fabrication of an integrated circuit, according to one embodiment. FIG. 10 illustrates an example set of processes 1000 used during the design, verification, and fabrication of an integrated circuit on a semiconductor die to transform and verify design data and instructions that represent the integrated circuit. Each of these processes can be structured and enabled as multiple modules or operations. The term "EDA" signifies Electronic Design Automation. These processes start, at block 1010, with the creation of a product idea with information supplied by a designer, information that is transformed to create an integrated circuit that uses a set of EDA processes, at block 1012. When the design is finalized, the design is taped-out, at block 1034, which is when artwork (e.g., geometric patterns) for the integrated circuit is sent to a fabrication facility to manufacture the mask set, which is then used to manufacture the integrated circuit. After tape-out, at block 1036, the integrated circuit is fabricated on a semiconductor die, and at block 1038, packaging and assembly processes are performed to produce, at block 1040, the finished integrated circuit (oftentimes, also referred to as "chip" or "integrated circuit chip").

Specifications for a circuit or electronic structure may range from low-level transistor material layouts to high-level description languages. A high-level of abstraction may be used to design circuits and systems, using a hardware description language (HDL) such as VHDL, Verilog, SystemVerilog, SystemC, MyHDL or OpenVera. The HDL description can be transformed to a logic-level RTL description, a gate-level description, a layout-level description, or a mask-level description. Each lower abstraction level that is a less abstract description adds more useful detail into the design description, such as, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 10. The processes described may be enabled by EDA products (or tools).

During system design, at block 1014, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification, at block 1016, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some examples, special systems of components, referred to as emulators or prototyping systems, are used to speed up the functional verification.

During synthesis and design for test, at block 1018, HDL code is transformed to a netlist. In some examples, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification, at block 1020, the netlist is checked for compliance with timing constraints and for correspondence with the HDL code. During design planning, at block 1022, an overall floor plan for the integrated circuit is constructed and analyzed for timing and top-level routing.

During layout or physical implementation, at block 1024, physical placement (positioning of circuit components, such as transistors or capacitors) and routing (connection of the circuit components by multiple conductors) occurs, and the selection of cells from a library to enable specific logic functions can be performed. As used herein, the term "cell" may specify a set of transistors, other components, and interconnections that provides a Boolean logic function (e.g., AND, OR, NOT, XOR) or a storage function (such as a flip-flop or latch). As used herein, a circuit "block" may refer to two or more cells. Both a cell and a circuit block can be referred to as a module or component and are enabled as both physical structures and in simulations. Parameters are specified for selected cells (based on standard cells) such as size and made accessible in a database for use by EDA products.

During analysis and extraction, at block 1026, the circuit function is verified at the layout level, which permits refinement of the layout design. During physical verification, at block 1028, the layout design is checked to ensure that manufacturing constraints are correct, such as design rule check (DRC) constraints, electrical constraints, lithographic constraints, and that circuitry function matches the HDL design specification. During resolution enhancement, at block 1030, the geometry of the layout is transformed to improve how the circuit design is manufactured.

During tape-out, data is created to be used (after lithographic enhancements are applied if appropriate) for production of lithography masks. During mask data preparation, at block 1032, the tape-out data is used to produce lithography masks that are used to produce finished integrated circuits. In an embodiment, lithography masks can be produced using one or more of the techniques described above, in connection with FIGS. 1-9.

A storage subsystem of a computer system may be used to store the programs and data structures that are used by some or all of the EDA products described herein, and products used for development of cells for the library and for physical and logical design that use the library.

Figure 11:
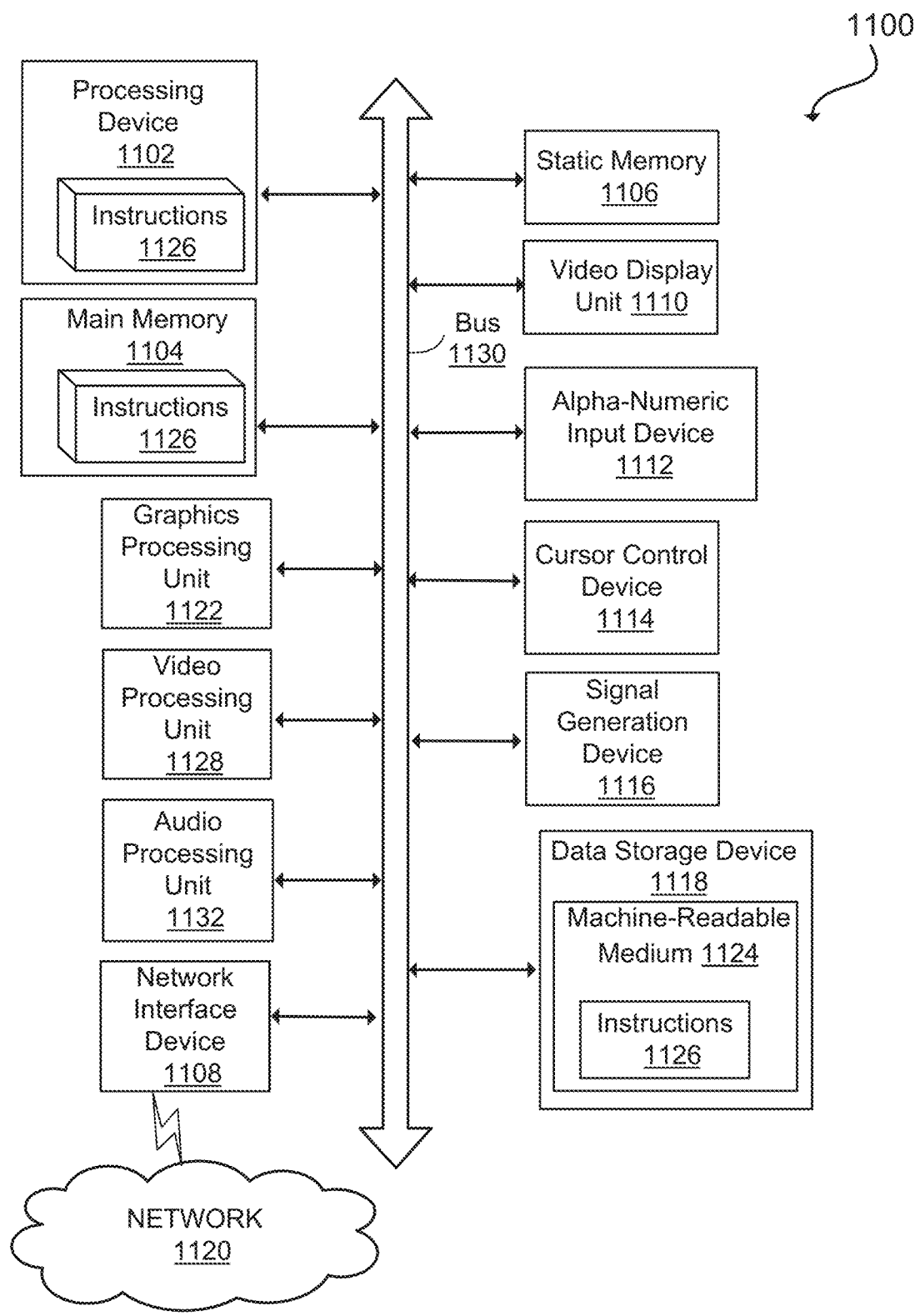
FIG. 11 illustrates an example of a computer system within which a set of instructions, for causing the computer system to perform any one or more of the methodologies discussed herein, may be executed, according to one embodiment.

FIG. 11 illustrates an example of a computer system 1100 within which a set of instructions, for causing the computer system to perform any one or more of the methodologies discussed herein, may be executed. In some implementations, the computer system may be connected (e.g., networked) to other machines or computer systems in a local area network (LAN), an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that computer system. Further, while a single computer system is illustrated, the term computer system shall also be taken to include any collection of computer systems that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130. The main memory 1104 includes or is a non-transitory computer readable medium. The main memory 1104 (e.g., a non-transitory computer readable medium) can store one or more sets of instructions 1126, that when executed by the processing device 1102, cause the processing device 1102 to perform some or all of the operations, steps, methods, and processes described herein.

Processing device 1102 represents one or more processors such as a microprocessor, a central processing unit, or the like. More particularly, the processing device 1102 may be or include complex instruction set computing (CISC) microprocessor, reduced instruction set computing (RISC) microprocessor, very long instruction word (VLIW) microprocessor, a processor implementing other instruction sets, or processor(s) implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing some or all of the operations, steps, methods, and processes described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (e.g., a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also including machine-readable storage media.

In some implementations, the instructions 1126 include instructions to implement functionality described above. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the computer system and that cause the computer system and the processing device 1102 to perform any one or more of the methodologies described above. The term "machine-readable storage medium" shall accordingly be taken to include, but not be limited to, solid-state memories, optical media, and magnetic media.

Various features are described herein with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed subject matter or as a limitation on the scope of the claimed subject matter. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

In view of the foregoing, the scope of the present disclosure is determined by the claims that follow.

What is claimed is:

1. A method comprising:
    converting, by a processor, a design pattern for a semiconductor device to a pixel domain, to provide a converted design pattern;
    providing the converted design pattern as input to a trained machine learning (ML) model;
    performing, using the ML Model, a plurality of dilated convolutions relating to the converted design pattern;
    inferring, using the ML model, a mask for use in manufacturing the semiconductor device, based on the plurality of dilated convolutions; and
    converting the inferred mask from a level-set function to a polygon representation, wherein the level-set function defines contours of the inferred mask.

2. The method of claim 1, wherein each convolution in the ML model is a dilated convolution comprising a kernel dilation factor greater than 1.

3. The method of claim 1, further comprising:
    determining a kernel dilation factor for each of the plurality of dilated convolutions based on a target ambit.

4. The method of claim 3, further comprising:
    determining depth and kernel width for the ML model based on the target ambit.

5. The method of claim 1, further comprising providing a simulated image relating to using the design pattern as a mask for manufacturing the semiconductor device, to the ML model.

6. The method of claim 1, wherein the ML model comprises one or more of a mirrored convolution and a rotated convolution.

7. The method of claim 1, wherein the ML model is trained in part based on the design pattern for the semiconductor device.

8. A system comprising:
    a processor; and
    a memory storing instructions, which when executed by the processor, cause the processor to perform operations comprising:
        converting a design pattern for a semiconductor device to a pixel domain, to provide a converted design pattern;
        providing the converted design pattern as input to a trained machine learning (ML) model;
        performing, using the ML Model, a plurality of dilated convolutions relating to the converted design pattern;
        inferring, using the ML model, one or more masks for use in manufacturing the semiconductor device, based on the plurality of dilated convolutions; and
        converting the inferred mask from a level-set function to a polygon representation.

9. The system of claim 8, wherein each convolution in the ML model is a dilated convolution comprising a kernel dilation factor greater than 1.

10. The system of claim 8, the operations further comprising:
    determining a kernel dilation factor for each of the plurality of dilated convolutions based on a target ambit.

11. The system of claim 10, the operations further comprising:
    determining depth and kernel width for the ML model based on the target ambit.

12. The system of claim 8, wherein the operations further comprise providing a simulated image relating to using the design pattern as a mask for manufacturing the semiconductor device, to the ML model.

13. The system of claim 8, wherein the ML model comprises one or more of a mirrored convolution and a rotated convolution.

14. The system of claim 8, wherein the ML model is trained in part based on the design pattern for the semiconductor device.

15. A non-transitory computer program product comprising:
    a non-transitory computer-readable storage medium having computer-readable program code embodied therewith, the computer-readable program code executable by one or more computer processors to perform an operations, the operations comprising:

converting a design pattern for a semiconductor device to a pixel domain, to provide a converted design pattern;
providing the converted design pattern as input to a trained machine learning (ML) model;
performing, using the ML Model, a plurality of dilated convolutions relating to the design pattern;
inferring, using the ML model, one or more masks for use in manufacturing the semiconductor device, based on the plurality of dilated convolutions; and
converting the inferred mask from a level-set function to a polygon representation.

16. The non-transitory computer program product of claim 15, wherein each convolution in the ML model is a dilated convolution comprising a kernel dilation factor greater than 1.

17. The non-transitory computer program product of claim 15, the operations further comprising:
determining a kernel dilation factor for each of the plurality of dilated convolutions based on a target ambit.

18. The non-transitory computer program product of claim 17, the operations further comprising:
determining depth and kernel width for the ML model based on the target ambit.

19. The non-transitory computer program product of claim 15, wherein the ML model comprises one or more of a mirrored convolution and a rotated convolution.

20. The non-transitory computer program product of claim 15, wherein the ML model is trained in part based on the design pattern for the semiconductor device.

* * * * *